United States Patent
Shi et al.

(10) Patent No.: US 10,050,020 B2
(45) Date of Patent: Aug. 14, 2018

(54) STACK-TYPE SEMICONDUCTOR PACKAGE

(71) Applicant: SAMSUNG ELECTRONICS CO., LTD., Suwon-si (KR)

(72) Inventors: Hongbin Shi, Hwaseong-si (KR); Junho Lee, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/418,077

(22) Filed: Jan. 27, 2017

(65) Prior Publication Data

US 2017/0294413 A1 Oct. 12, 2017

(30) Foreign Application Priority Data

Apr. 11, 2016 (KR) .................. 10-2016-0044372

(51) Int. Cl.
*H01L 25/065* (2006.01)
*H01L 23/31* (2006.01)

(52) U.S. Cl.
CPC ...... *H01L 25/0657* (2013.01); *H01L 23/3128* (2013.01); *H01L 23/3178* (2013.01);
(Continued)

(58) Field of Classification Search
CPC ..... H01L 23/00; H01L 23/31; H01L 23/3128; H01L 23/3178; H01L 25/0657;
(Continued)

(56) References Cited

U.S. PATENT DOCUMENTS

| 2010/0237484 A1* | 9/2010 | Han | H01L 21/565 |
| | | | 257/686 |
| 2012/0280404 A1* | 11/2012 | Kwon | H01L 23/3737 |
| | | | 257/777 |

(Continued)

FOREIGN PATENT DOCUMENTS

KR  10-2010-0009941  1/2010

OTHER PUBLICATIONS

Wang et al., "Analysis of the Reliability of Package-on-Package Devices Manufactured Using Various Underfill Methods", 2008 International Conference on Electronic Packaging Technology & High Density Packaging (ICEPT-HDP 2008).

*Primary Examiner* — Chuong A Luu
(74) *Attorney, Agent, or Firm* — F. Chau & Associates, LLC

(57) ABSTRACT

A semiconductor package includes a lower package including a lower package substrate, a lower semiconductor chip disposed on the lower package substrate, and a lower mold layer disposed on the lower package substrate, and an upper package disposed on the lower package. The upper package includes an upper package substrate and an upper semiconductor chip disposed on the upper package substrate. The semiconductor package additionally includes connection terminals disposed between the lower and upper package substrates. The connection terminals comprise outermost connection terminals and inner connection terminals. The inner connection terminals are disposed between the lower semiconductor chip and outermost connection terminals. The semiconductor package further includes a first under-fill layer disposed between the lower package substrate and the upper package substrate. At least one of the outermost connection terminals is disposed outside of the lower mold layer.

20 Claims, 23 Drawing Sheets

(52) U.S. Cl.
CPC ............... *H01L 2224/16225* (2013.01); *H01L 2224/48091* (2013.01); *H01L 2224/73265* (2013.01); *H01L 2225/06513* (2013.01); *H01L 2225/06517* (2013.01); *H01L 2225/06586* (2013.01); *H01L 2924/181* (2013.01); *H01L 2924/18161* (2013.01)

(58) Field of Classification Search
CPC ........... H01L 25/10; H01L 2224/16225; H01L 2224/48091; H01L 2224/73265; H01L 2225/06513; H01L 2225/06517; H01L 2225/06586; H01L 2924/181; H01L 2924/18161
USPC ........................................................ 257/693
See application file for complete search history.

(56) References Cited

U.S. PATENT DOCUMENTS

| | | |
|---|---|---|
| 2014/0231984 A1 | 8/2014 | Chen |
| 2015/0070865 A1 | 3/2015 | Yew et al. |
| 2015/0123290 A1* | 5/2015 | Kim ...................... H01L 25/105 257/777 |
| 2015/0130041 A1 | 5/2015 | Seo et al. |
| 2015/0147847 A1 | 5/2015 | Hsu et al. |
| 2015/0318262 A1 | 11/2015 | Gu et al. |
| 2015/0340349 A1* | 11/2015 | Yu ......................... H01L 25/105 257/777 |
| 2015/0342046 A1* | 11/2015 | Kim .................... H01L 23/5385 361/761 |
| 2015/0348955 A1 | 12/2015 | Wu |

* cited by examiner

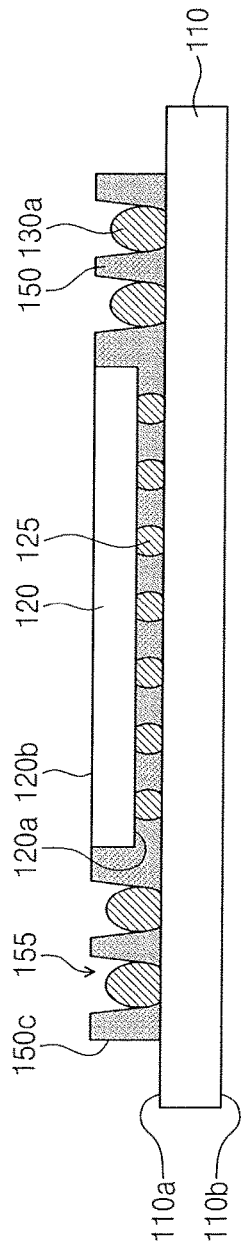
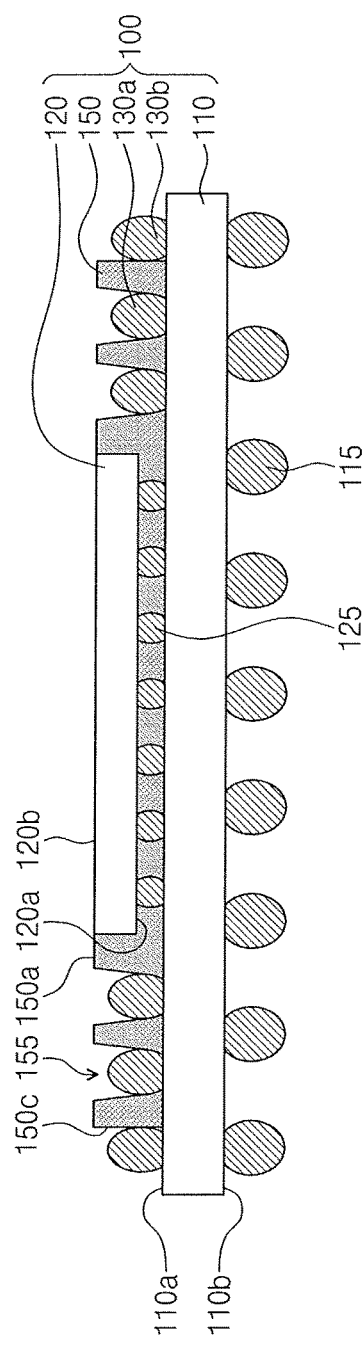

STACK-TYPE SEMICONDUCTOR PACKAGE

CROSS-REFERENCE TO RELATED APPLICATION

This U.S. non-provisional patent application claims priority under 35 U.S.C. § 119 to Korean Patent Application No. 10-2016-0044372 filed on Apr. 11, 2016 in the Korean Intellectual Property Office, the disclosure of which is incorporated by reference herein in its entirety.

TECHNICAL FIELD

Exemplary embodiments of the present inventive concept relate to a semiconductor package, and more particularly, to a stack-type semiconductor package.

DISCUSSION OF THE RELATED ART

To attend to an increasing demand for small (e.g., thin) and high capacity semiconductor devices and/or electronic devices, various package technologies have been developed. One kind of package technology includes semiconductor chips being vertically stacked to provide a high density of circuitry. This package technology can integrate many kinds of semiconductor chips in smaller areas compared to an amount of integration available using a general package with a single semiconductor chip.

However, producing multi-chip stack packages may result in a smaller yield compared to a yield from producing single chip packages. As a result, a package-on-package (POP) technology was developed.

SUMMARY

According to exemplary embodiments of the present inventive concept, a semiconductor package includes a lower package including a lower package substrate, a lower semiconductor chip disposed on the lower package substrate, and a lower mold layer disposed on the lower package substrate. The semiconductor package further includes an upper package disposed on the lower package. The upper package includes an upper package substrate and an upper semiconductor chip disposed on the upper package substrate. The semiconductor package additionally includes a plurality of connection terminals disposed between the lower and upper package substrates. The plurality of connection terminals includes a plurality of outermost connection terminals and a plurality of inner connection terminals. The plurality of inner connection terminals is disposed between the lower semiconductor chip and the plurality of outermost connection terminals. The semiconductor package further includes a first under-fill layer disposed between the lower package substrate and the upper package substrate. At least one of the plurality of outermost connection terminals is disposed outside of the lower mold layer.

According to exemplary embodiments of the present inventive concept, a semiconductor package includes a lower package including a lower package substrate, a lower semiconductor chip disposed on the lower package substrate, and a lower mold layer disposed on the lower package substrate. The semiconductor package further includes an upper package disposed on the lower package. The upper package includes an upper package substrate and an upper semiconductor chip disposed on the upper package substrate. The semiconductor package additionally includes an under-fill layer disposed between the lower mold layer and the upper package substrate. The semiconductor package further includes a plurality of connection terminals disposed between the lower package and the upper package. The plurality of connection terminals connects the lower package to the upper package. The lower mold layer includes a first lower mold layer in contact with side surfaces of the lower semiconductor chip. The lower mold layer further includes a second lower mold layer connected to the first lower mold layer and enclosing at least lower side surfaces of each of the plurality of connection terminals. The first lower mold layer has a top surface that is positioned at a higher level than a top surface of the second lower mold layer.

According to exemplary embodiments of the present inventive concept, a semiconductor package includes a first package including a lower package substrate, a lower semiconductor chip disposed on the lower package substrate, and a lower mold layer disposed on the lower package substrate. The semiconductor package further includes a second package disposed on the first package. The second package includes an upper package substrate and an upper semiconductor chip disposed on the upper package substrate. The semiconductor package additionally includes a plurality of connection terminals disposed between the lower and upper package substrates. The plurality of connection terminals electrically connects the first package and the second package. The semiconductor package further includes an under-fill layer disposed on the lower package substrate. The lower mold layer includes a first lower mold layer in contact with side surfaces of the lower semiconductor chip. The lower mold layer further includes a second lower mold layer enclosing at least lower side surfaces of each of the plurality of connection terminals. At least one connection terminal of the plurality of connection terminals has a side surface in contact with the under-fill layer.

BRIEF DESCRIPTION OF THE DRAWINGS

The above and other features of the present inventive concept will become more apparent by describing in detail exemplary embodiments thereof, with reference to the accompanying drawings, in which:

FIGS. 6A, 6B, 6C and 6D are sectional views illustrating a method of fabricating a lower package, according to an exemplary embodiment of the present inventive concept;

DETAILED DESCRIPTION

Exemplary embodiments of the present inventive concept will be described more fully hereinafter with reference to the accompanying drawings.

It should be noted that these figures are intended to illustrate the general characteristics of methods, structure and/or materials utilized in certain exemplary embodiments of the present inventive concept and to supplement the written description provided below. These drawings might not be drawn to scale. For example, the relative thicknesses and positioning of molecules, layers, regions and/or structural elements may be reduced or enlarged for clarity. The use of similar or identical reference numbers in the various drawings may indicate the presence of a similar or identical element or feature.

Figure 1:
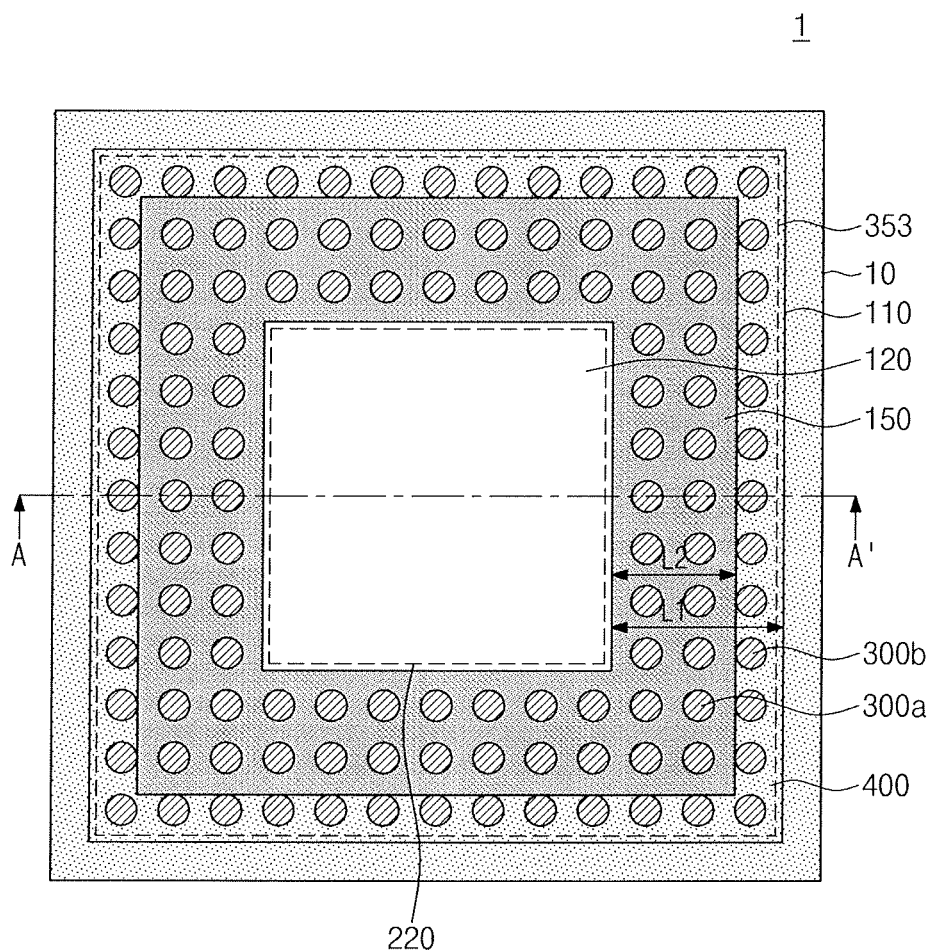
FIG. 1 is a schematic plan view illustrating a semiconductor package according to an exemplary embodiment of the present inventive concept.
Figure 2:
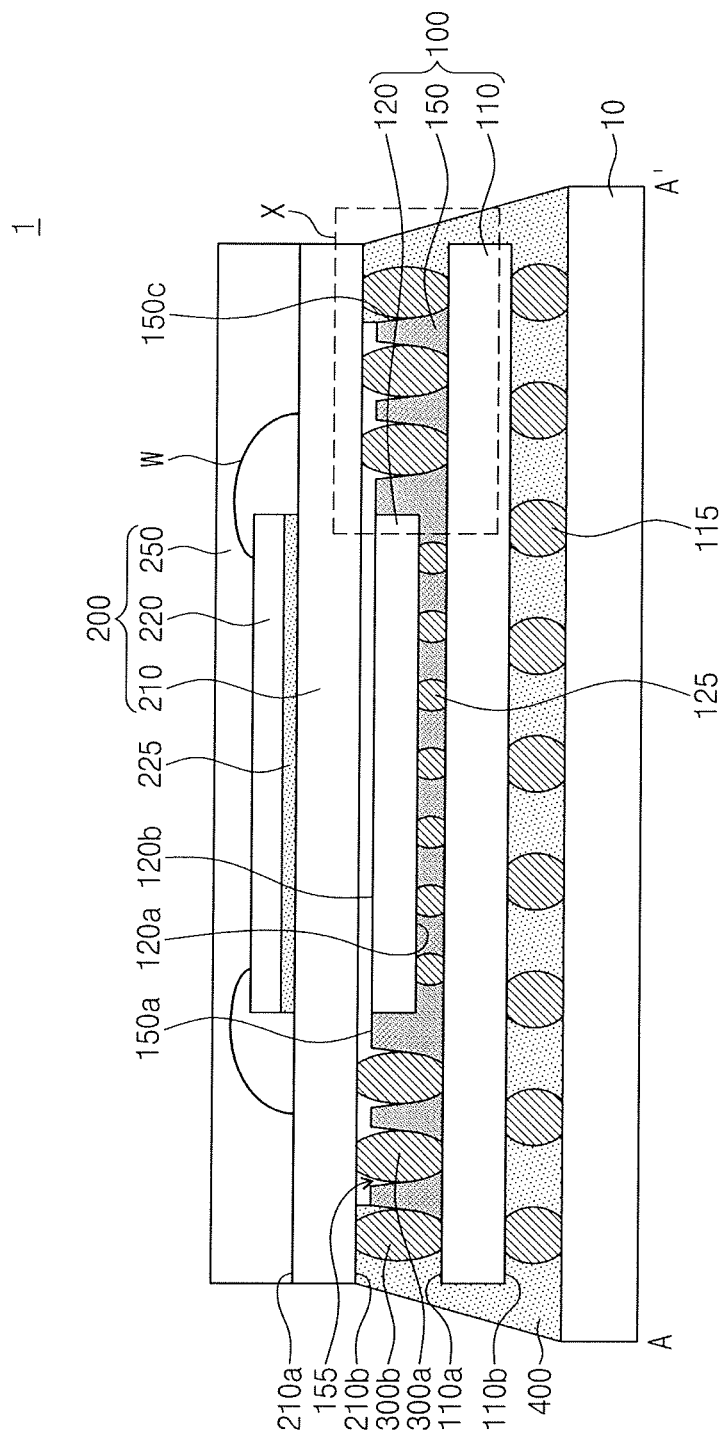
FIG. 2 is a sectional view taken along line A-A' of FIG. 1 according to an exemplary embodiment of the present inventive concept.
Figure 3A:
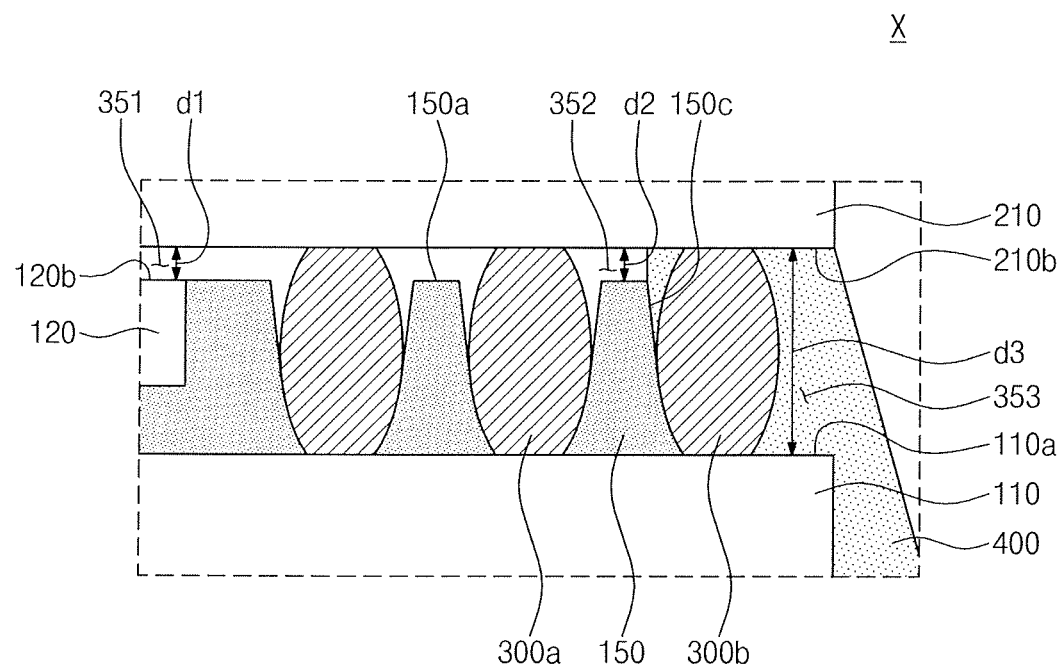
FIGS. 3A and 3B are enlarged views of a region 'X' of FIG. 1 according to an exemplary embodiment of the present inventive concept.
Figure 3B:
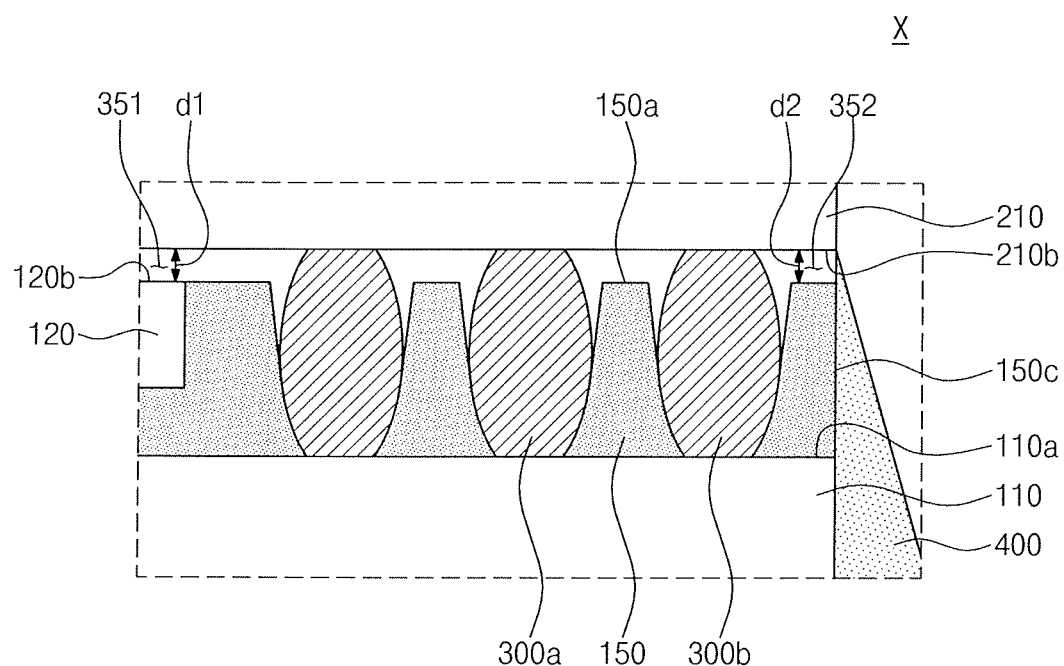

FIG. 1 is a schematic plan view illustrating a semiconductor package according to an exemplary embodiment of the present inventive concept, and FIG. 2 is a sectional view taken along line A-A' of FIG. 1 according to an exemplary embodiment of the present inventive concept. FIGS. 3A and 3B are enlarged views of a region 'X' of FIG. 1 according to an exemplary embodiment of the present inventive concept.

Referring to FIGS. 1, 2, and 3A, a semiconductor package 1 may include a board 10, a lower package 100, an upper package 200, connection terminals 300a and 300b, and an under-fill layer 400. The lower package 100 may be disposed on the board 10, and the upper package 200 may be disposed on the lower package 100. The board 10 may, for example, be a board for mobile products (e.g., cellular phones) or memory modules. A plurality of terminals (e.g., 300a and 300b) may be disposed on an upper surface of the board 10.

The lower package 100 may include a lower package substrate 110, a lower semiconductor chip 120, and a lower mold layer 150. The lower package substrate 110 may, for example, be a printed circuit board (PCB) with circuit patterns. The lower package substrate 110 may include a top surface 110a and a bottom surface 110b. Conductive pads may be disposed on the top surface 110a of the lower package substrate 110, and the conductive pads may be electrically connected to the connection terminals 300a and 300b. The connection terminals 300a and 300b may be in contact with the conductive pads. Outer terminals 115 (e.g., solder balls) may be disposed on the bottom surface 110b of the lower package substrate 110. The outer terminals 115 may connect the lower package substrate 110 electrically to the board 10. For example, the outer terminals 115 may be in direct contact with the board 10. For example, the outer terminals 115 may include tin (Sn), silver (Ag), copper (Cu), nickel (Ni), bismuth (Bi), indium (In), antimony (Sb), cerium (Ce), or alloys containing at least one of the aforementioned elements.

The lower semiconductor chip 120 may be mounted on the top surface 110a of the lower package substrate 110. When viewed in a plan view, as shown in FIG. 1, the lower semiconductor chip 120 may be disposed on a center region of the lower package substrate 110. For example, when viewed in a plan view, as shown in FIG. 1, a side surface of the lower semiconductor chip 120 may be spaced apart from an edge of the lower package substrate 110 by a first distance L1. The lower semiconductor chip 120 may have a first surface 120a that functions as an active surface and a second surface 120b that functions as an inactive surface. For example, the first surface 120a and the second surface 120b may be facing one another, and the second surface 120b may be above the first surface 120a. For example, the lower semiconductor chip 120 may be disposed in such an orientation that the active surface thereof faces the top surface 110a of the lower package substrate 110. The lower semiconductor chip 120 may include a logic chip and/or a memory chip. For example, the memory chip may be a dynamic random access memory (DRAM) chip, a NAND FLASH chip, a NOR FLASH chip, a One NAND chip, a phase-change RAM (PRAM) chip, a resistive RAM (ReRAM) chip, and/or a magnetic RAM (MRAM) chip. The logic chip may be a controller, a micro-processor, an application processor, and/or a system-on-chip. Connection terminals 125 (e.g., solder balls or solder bumps) may be disposed between the lower semiconductor chip 120 and the lower package substrate 110. The connection terminals 125 may electrically connect the lower semiconductor chip 120 to the lower package substrate 110. In an exemplary embodiment of the present inventive concept, the connection terminals 125 may include substantially the same material as the outer terminals 115.

The lower mold layer 150 may be disposed on the lower package substrate 110. The lower mold layer 150 may include a top surface 150a and outer side surfaces 150c. The lower mold layer 150 may fill a gap region between the lower semiconductor chip 120 and the lower package substrate 110 and may cover side surfaces of the lower semiconductor chip 120. In addition, the lower mold layer 150 may cover portions of the first surface 120a of the lower semiconductor chip 120. The lower mold layer 150 may be provided such that the second surface 120b of the lower semiconductor chip 120 is exposed. The top surface 150a of the lower mold layer 150 may be positioned at substantially the same level as the second surface 120b of the lower semiconductor chip 120. In an exemplary embodiment of the present inventive concept, the lower mold layer 150 may expose an edge region of the lower package substrate 110. For example, the lower mold layer 150 may be provided such that the top surface 110a of the lower package substrate 110 is exposed in a rectangular shape.

In an exemplary embodiment of the present inventive concept, when viewed in a plan view, as shown in FIG. 1, the lower mold layer 150 may extend from the side surface of the lower semiconductor chip 120 to a gap region between the outermost connection terminals 300b and the inner connection terminals 300a adjacent thereto. Further, a second distance L2 between the side surface of the lower semiconductor chip 120 and the outer side surface 150c of the lower mold layer 150 adjacent thereto may be less than the first distance L1 between the side surface of the lower semiconductor chip 120 and the edge of the lower package substrate 110 adjacent thereto.

The lower mold layer 150 may have connection holes 155 that are provided around the lower semiconductor chip 120. The connection holes 155 may form a plurality of rows and columns around the lower semiconductor chip 120. The lower mold layer 150 may include an insulating polymer material (e.g., an epoxy molding compound (EMC)).

The connection terminals 300a and 300b may be disposed between the lower package 100 and the upper package 200. In addition, the connection terminals 300a and 300b may be in direct contact with the lower package 100 and the upper package 200. When viewed in a plan view, as shown in FIG. 1, the connection terminals 300a and 300b may be disposed between the side surfaces of the lower semiconductor chip 120 and edges of the lower package substrate 110. Further, the connection terminals 300a and 300b may form a plurality of rows and columns around the lower semiconductor chip 120.

The connection terminals 300a and 300b may include inner connection terminals 300a that are provided in the lower mold layer 150 and outermost connection terminals 300b that are provided outside the lower mold layer 150. For example, the inner connection terminals 300a may be disposed in the connection holes 155, and the outermost connection terminals 300b may be disposed on a portion of the top surface 110a of the lower package substrate 110 that is exposed by the lower mold layer 150. The outermost connection terminals 300b may be in contact with the outer side surfaces 150c of the lower mold layer 150. Side surfaces of the outermost connection terminals 300b may be exposed by a space between the top surface 110a of the lower package substrate 110 exposed by the lower mold layer 150 and a bottom surface of an upper package substrate 210.

The connection terminals 300a and 300b may include a conductive material (e.g., tin (Sn), silver (Ag), copper (Cu), nickel (Ni), bismuth (Bi), indium (In), antimony (Sb), cerium (Ce), or alloys containing at least one of the aforementioned elements). However, the conductive material for the connection terminals 300a and 300b is not limited to the above examples.

The upper package 200 may include the upper package substrate 210, an upper semiconductor chip 220, and an upper mold layer 250. The upper package substrate 210 may be a printed circuit board (PCB) with circuit patterns. The upper package substrate 210 may include a top surface 210a and a bottom surface 210b. Conductive pads may be disposed on the bottom surface 210b of the upper package substrate 210, and the conductive pads may be electrically connected to the connection terminals 300a and 300b. The connection terminals 300a and 300b may be in contact with the conductive pads. The bottom surface 210b of the upper package substrate 210 may be spaced apart from the second surface 120b of the lower semiconductor chip 120 and the top surface 150a of the lower mold layer 150. Here, a space between the bottom surface 210b of the upper package substrate 210 and the second surface 120b of the lower semiconductor chip 120 may be referred to as a first space 351. Further, a space between the bottom surface 210b of the upper package substrate 210 and the top surface 150a of the lower mold layer 150 may be referred to as a second space 352. In addition, a space between the bottom surface 210b of the upper package substrate 210, the outer side surface 150c of the lower mold layer 150, and the top surface 110a of the lower package substrate 110 exposed by the outermost connection terminals 300b may be referred to as a third space 353. As shown in FIG. 3A, the first space 351 may have a first height d1 that is a distance between the bottom surface 210b of the upper package substrate 210 and the second surface 120b of the lower semiconductor chip 120. In addition, the second space 352 may have a second height d2 that is a distance between the bottom surface 210b of the upper package substrate 210 and the top surface 150a of the lower mold layer 150. Further, the third space 353 may have a third height d3 that is a distance between the bottom surface 210b of the upper package substrate 210 and the top surface 110a of the lower package substrate 110. The first height d1 may be substantially equal to the second height d2, and the third height d3 may be greater than both the first height d1 and the second height d2.

The upper semiconductor chip 220 may be mounted on the top surface 210a of the upper package substrate 210. For example, the upper semiconductor chip 220 may be attached to the top surface 210a of the upper package substrate 210 by an adhesive layer 225. Here, the upper semiconductor chip 220 may be electrically connected to the upper package substrate 210 through wires w. The wires w may be formed of or otherwise include gold (Au), silver (Ag), platinum (Pt), aluminum (Al), copper (Cu), palladium (Pd), nickel (Ni), cobalt (Co), chromium (Cr), and/or titanium (Ti). According to an exemplary embodiment of the present inventive concept, the upper semiconductor chip 220 might not be limited to the above mounting arrangement or structure on which the upper semiconductor chip 220 is mounted on. The upper semiconductor chip 220 may be, for example, a logic chip, a memory chip, or a combination thereof, and here, the kind of the upper semiconductor chip 220 may be the same as, or different from, that of the lower semiconductor chip 120.

The upper mold layer 250 may be disposed on the upper package substrate 210 to cover the upper semiconductor chip 220. The upper mold layer 250 may include substantially the same material as the lower mold layer 150. However, exemplary embodiments of the present inventive concept are not limited thereto.

The under-fill layer 400 may be provided between the bottom surface 110b of the lower package substrate 110 and the top surface of the board 10 and may be in contact with them. Further, the under-fill layer 400 may enclose the outer terminals 115 that may be disposed between the bottom surface 110b of the lower package substrate 110 and the top surface of the board 10. In addition, the under-fill layer 400 may be disposed on the edge region of the lower package substrate 110 exposed by the lower mold layer 150 and the outermost connection terminal 300b. For example, the under-fill layer 400 may fill the third space 353 and may be in contact with the side surfaces of the outermost connection terminals 300b exposed by the third space 353. For example, the under-fill layer 400 may be provided between edges of the lower mold layer 150 and at least a portion of the side surfaces of the outermost connection terminals 300b. Further, the under-fill layer 400 may be provided between edges of the lower mold layer 150 and edges of the lower package substrate 110. The under-fill layer 400 may be in contact with the top surface 110a of the lower package substrate 110 and the bottom surface 210b of the upper package substrate 210 exposed by the third space 353. The under-fill layer 400 may include a resin material.

In addition, the outer side surface 150c of the lower mold layer 150 may be coplanar with the side surface of the lower package substrate 110, as shown in FIG. 3B. For example, the first and second distances L1 and L2 of FIG. 1 may be substantially the same. As a result, the third space 353 shown in FIG. 3A might not be provided. In addition, the side surfaces of the outermost connection terminal 300b may be covered by the lower mold layer 150. Further, in FIG. 3B, the second height d2 of the second space 352 may be less than the third height d3 of the third space 353, as shown in FIG. 3A, and in this case, the under-fill layer 400 injected into the second space 352 might not be in contact with the outermost connection terminals 300b. For example, the under-fill layer 400 may be in contact with the side surface 150c of the lower mold layer 150. As a result, an empty space may be formed between the edge regions of the lower and upper package substrates 110 and 210. This empty space may lead to a difficulty in protecting the semiconductor package against an external or internal force (e.g., physical impact).

According to an exemplary embodiment of the present inventive concept, the under-fill layer 400 may be injected into the third space 353. Since the third height d3 of the third space 353 is greater than the second height d2 of the second space 352, the third space 353 may be filled with the under-fill layer 400. Thus, it is possible to effectively fix the edge region of the top surface 110a of the lower package substrate 110 and the edge region of the bottom surface 210b of the upper package substrate 210. Accordingly, it is possible to prevent the connection terminals 300a and 300b from being damaged by an external or internal force (e.g., a physical impact) and thereby to increase mechanical stiffness of the semiconductor package 1.

In an exemplary embodiment of the present inventive concept, a position of the under-fill layer 400 may be changed, depending on processing conditions, such as a concentration of a thermosetting resin and a process time. For example, if the thermosetting resin has a dilute concentration and the process time increases, the under-fill layer 400 may be injected farther out in a direction away from the edge of the lower package substrate 110 and toward the lower semiconductor chip 120. For example, the under-fill layer 400 may be formed to fill a portion of the second space 352 and the first space 351. In an exemplary embodiment of the present inventive concept, the under-fill layer 400 may be in contact with the side surfaces of the connection terminals 300a and 300b and the second surface 120b of the lower semiconductor chip 120. For example, the under-fill layer may be in contact with at least a portion of the side surfaces of the connection terminals 300a and 300b.

Figure 4A:
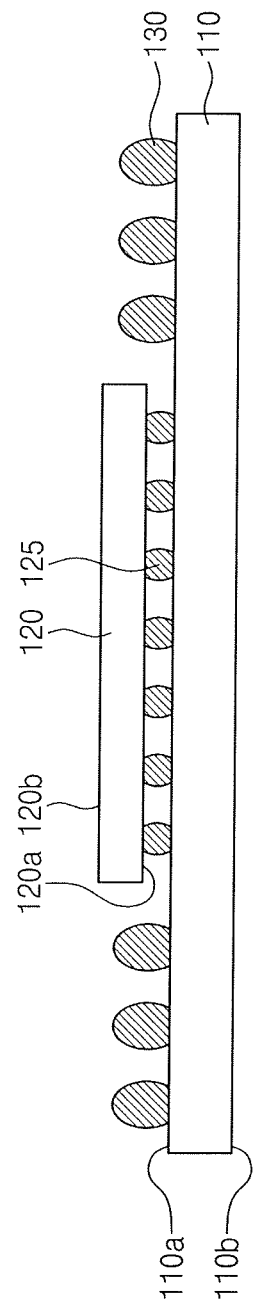
FIGS. 4A, 4B, 4C, 4D, 4E and 4F are sectional views illustrating a method of fabricating a semiconductor package, according to an exemplary embodiment of the present inventive concept.
Figure 4B:
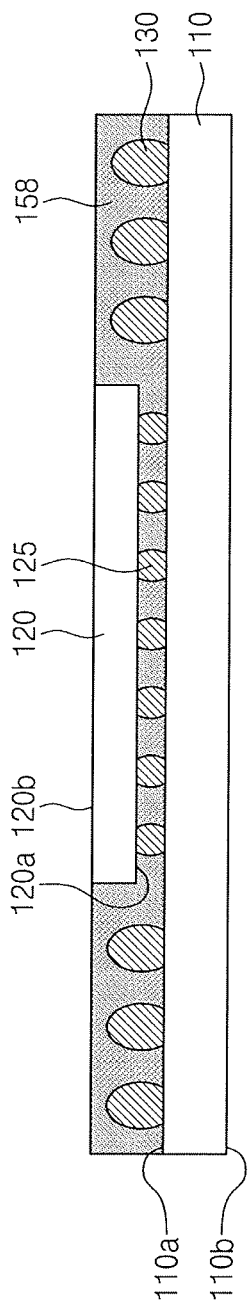
Figure 4C:
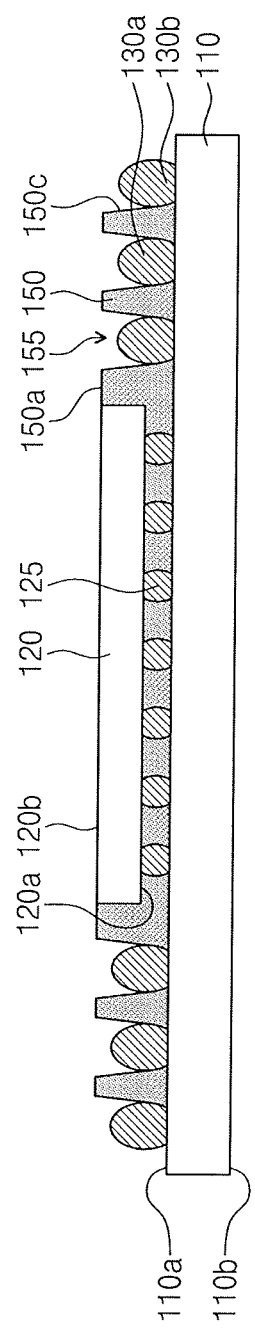
Figure 4D:
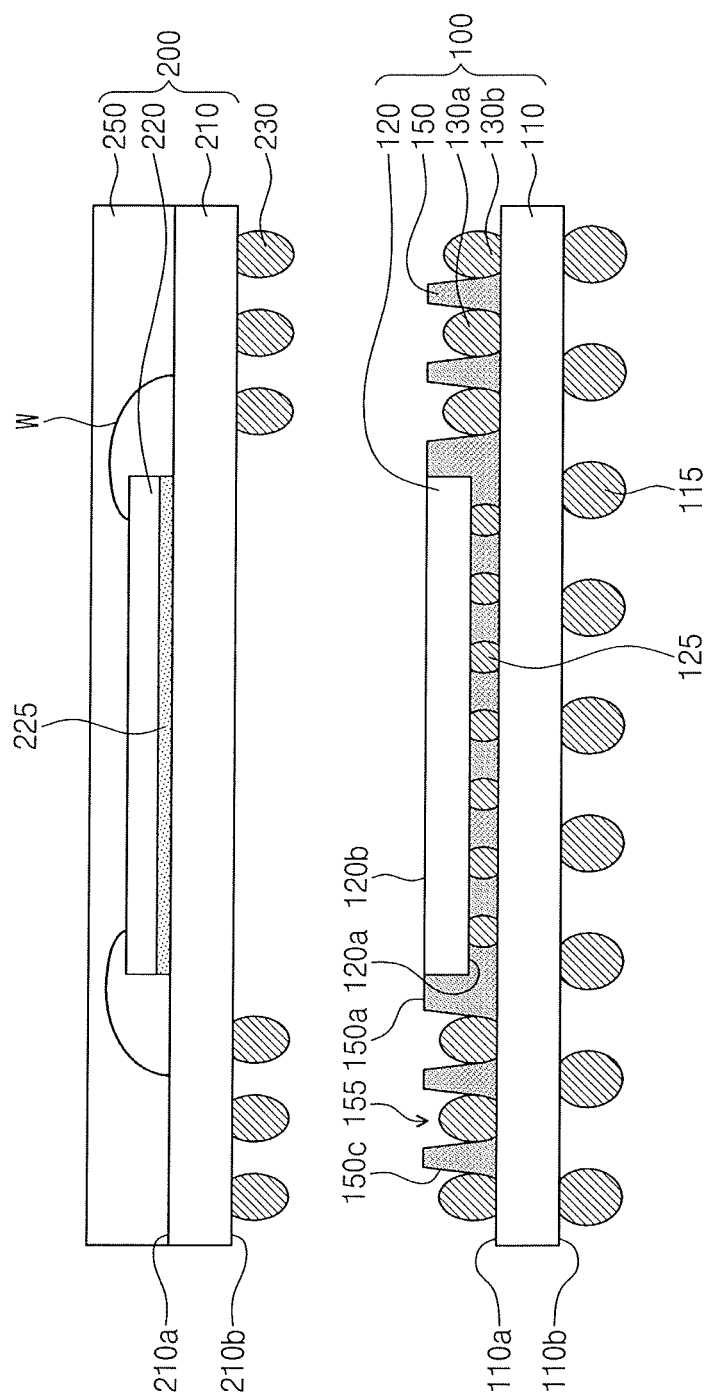
Figure 4E:
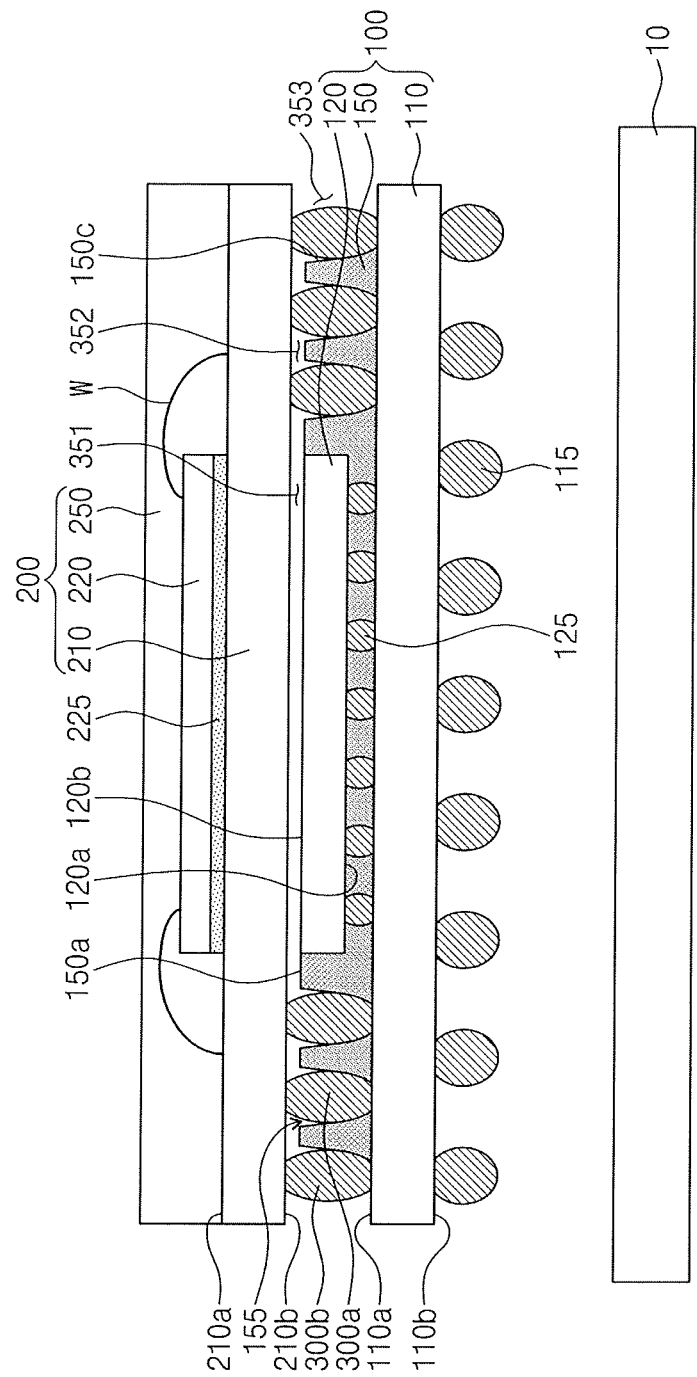
Figure 4F:
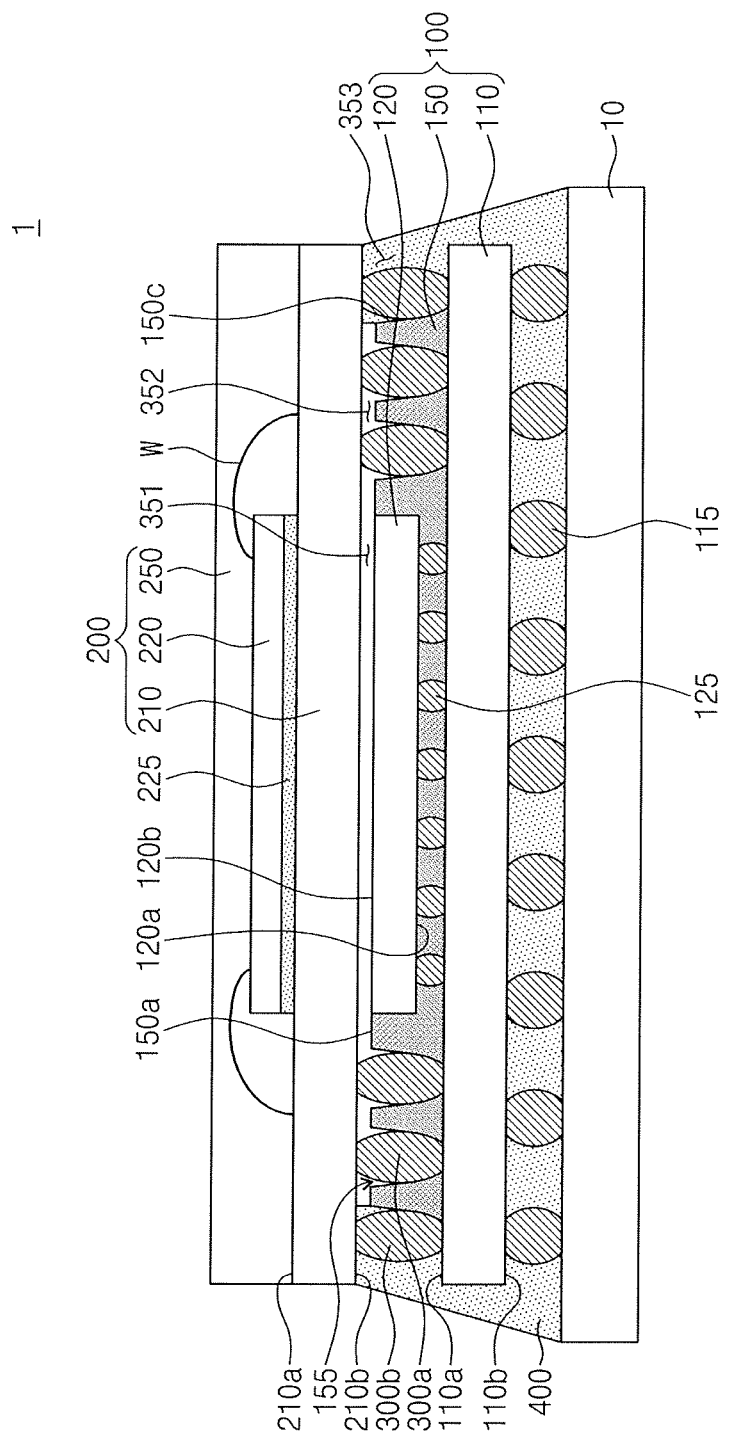
Figure 5:
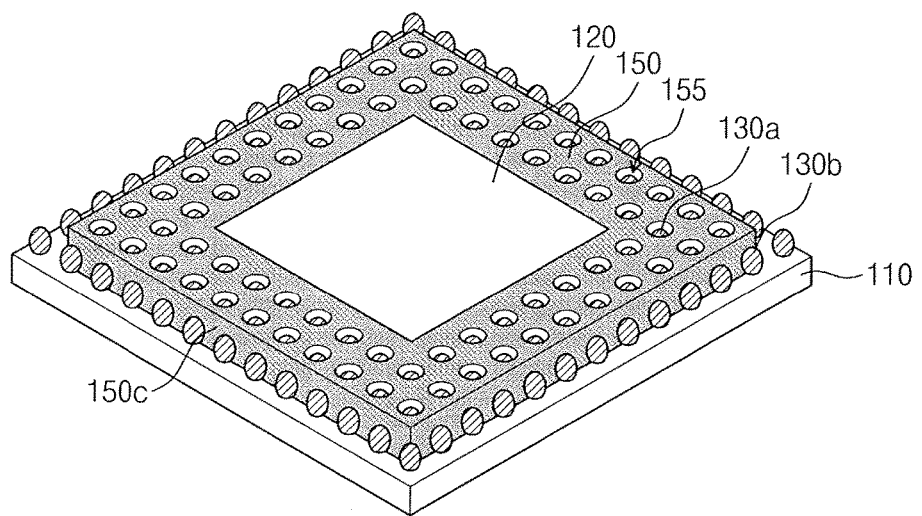
FIG. 5 is a perspective view of FIG. 4C according to an exemplary embodiment of the present inventive concept.

FIGS. 4A to 4F are sectional views illustrating a method of fabricating a semiconductor package, according to an exemplary embodiment of the present inventive concept, and FIG. 5 is a perspective view of FIG. 4C according to an exemplary embodiment of the present inventive concept. The elements and features of this example that are not described may be assumed to be similar to corresponding elements described above.

Referring to FIG. 4A, the lower semiconductor chip 120 and lower connection terminals 130 may be formed on the top surface 110a of the lower package substrate 110. The lower connection terminals 130 may be formed around the lower semiconductor chip 120. In an exemplary embodiment of the present inventive concept, the lower semiconductor chip 120 may be connected to the top surface 110a of the lower package substrate 110 by a flip-chip bonding method. The lower semiconductor chip 120 may be electrically connected to the lower package substrate 110 through the connection terminals 125. The lower connection terminals 130 may include a conductive material (e.g., tin (Sn), silver (Ag), copper (Cu), nickel (Ni), bismuth (Bi), indium (In), antimony (Sb), cerium (Ce), or alloys containing at least one of the aforementioned elements).

Referring to FIG. 4B, a preliminary lower mold layer 158 may be formed to cover the side surface of the lower semiconductor chip 120 and to still expose the second surface 120b of the lower semiconductor chip 120. The preliminary lower mold layer 158 may be formed to enclose the connection terminals 125 disposed between the lower semiconductor chip 120 and the lower package substrate 110. For example, the preliminary lower mold layer 158 may be formed around the connection terminals 125. In addition, the preliminary lower mold layer 158 may be formed to cover the lower connection terminals 130 disposed on the top surface 110a of the lower package substrate 110.

Referring to FIGS. 4C and 5, the preliminary lower mold layer 158 may be patterned to form the connection holes 155 exposing the lower connection terminals 130, and here, the preliminary lower mold layer 158 may be removed from the edge region of the top surface 110a of the lower package substrate 110. For example, the patterning of the preliminary lower mold layer 158 to form the connection holes 155 may be performed using a laser drilling process. As a result of the patterning process, the lower mold layer 150 may be formed. The lower mold layer 150 may be formed to expose the edge region of the lower package substrate 110 and provide connection holes 155. The lower connection terminals 130 may include the first lower connection terminals 130a, which are provided in the connection holes 155, and the second lower connection terminals 130b, which are provided outside the lower mold layer 150. The first lower connection terminals 130a may be formed in the lower mold layer 150, and the second lower connection terminals 130b may be formed outside the lower mold layer 150. Here, the second lower connection terminals 130b may be in contact with the outer side surface 150c of the lower mold layer 150.

Referring to FIG. 4D, the outer terminals 115 may be attached to the bottom surface 110b of the lower package substrate 110, thereby forming the lower package 100. Thereafter, the upper package 200 may be disposed on the lower package 100, thereby forming a stacked structure. The upper package 200 may include the upper package substrate 210, the upper semiconductor chip 220, and the upper mold layer 250. Upper connection terminals 230 may be disposed on the bottom surface 210b of the upper package substrate 210. The upper connection terminals 230 may include the same material as the lower connection terminals 130 disposed on the lower package substrate 110.

Referring to FIG. 4E, a reflow process may be performed on the stacked structure of the lower and upper packages 100 and 200 to form the connection terminals 300a and 300b. The reflow process may be performed on the lower connection terminals 130, which are in contact with the upper connection terminals 230. As a result of the reflow process, the lower connection terminals 130 and the upper connection terminals 230 may be connected to one another to form the connection terminals 300a and 300b. As a result of the process, the first space 351, the second space 352, and the third space 353 may be formed between the lower package 100 and the upper package 200. Thereafter, the board 10 may be disposed on the bottom surface 110b of the lower package substrate 110.

Referring to FIG. 4F, the board 10 may be connected to the outer terminals 115. Next, the under-fill layer 400 may be provided by injecting a thermosetting resin into the third space 353 and a space between the bottom surface 110b of the lower package substrate 110 and the board 10. For example, the under-fill layer 400 may be formed by a process of injecting and curing the thermosetting resin. The curing temperature of the thermosetting resin may be about 150° C. As a result of the formation of the under-fill layer 400, the semiconductor package 1 may be fabricated.

In addition, if the third space 353 is not formed, the thermosetting resin may have to be injected into a space between the lower mold layer 150 and the bottom surface 210b of the upper package substrate 210, and the space is where a distance between the lower mold layer 150 and the bottom surface 210b of the upper package substrate 210 is very small. Moreover, in the case where the thermosetting resin is not injected into the space between the lower mold layer 150 and the bottom surface 210b of the upper package substrate 210, the thermosetting resin may overflow; in this case, there is the possibility that the thermosetting resin may be in contact with another electronic device adjacent to the semiconductor package 1.

According to an exemplary embodiment of the present inventive concept, since the third space 353 is formed such that the top surface 110a of the lower package substrate 110 is exposed, the thermosetting resin may be injected into the space between the lower mold layer 150 and the bottom surface 210b of the upper package substrate 210 through the third space 353. Accordingly, it is possible to effectively form the under-fill layer 400 between the top surface 110a of the lower package substrate 110 and the bottom surface 210b of the upper package substrate 210.

FIGS. 6A to 6D are sectional views illustrating a method of fabricating a lower package, according to an exemplary embodiment of the present inventive concept. The elements and features of this example that are not described may be assumed to be similar to corresponding elements described above.

Figure 6A:
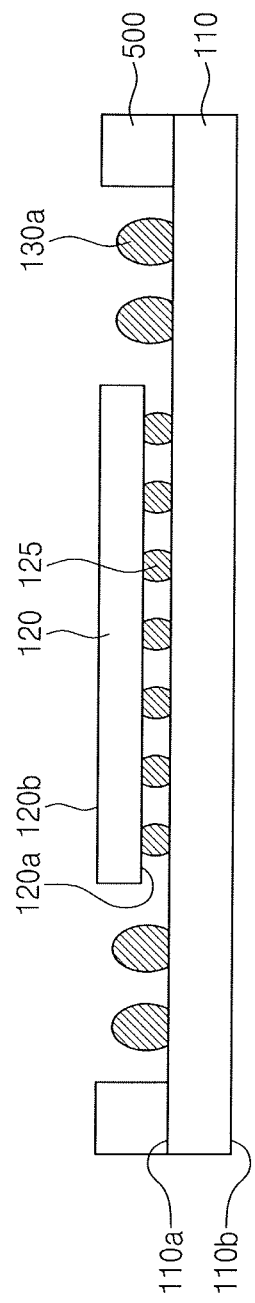

Referring to FIG. 6A, the lower semiconductor chip 120 and the first lower connection terminals 130a may be formed on the top surface 110a of the lower package substrate 110. The first lower connection terminals 130a may be formed around the lower semiconductor chip 120. A dummy block 500 may be formed on the edge region of the lower package substrate 110. When the dummy block 500 is formed, it may be spaced apart from the first lower connection terminals 130a. For example, the first lower connection terminals 130a might not be formed on the edge region of the top surface 110a of the lower package substrate 110.

Figure 6B:
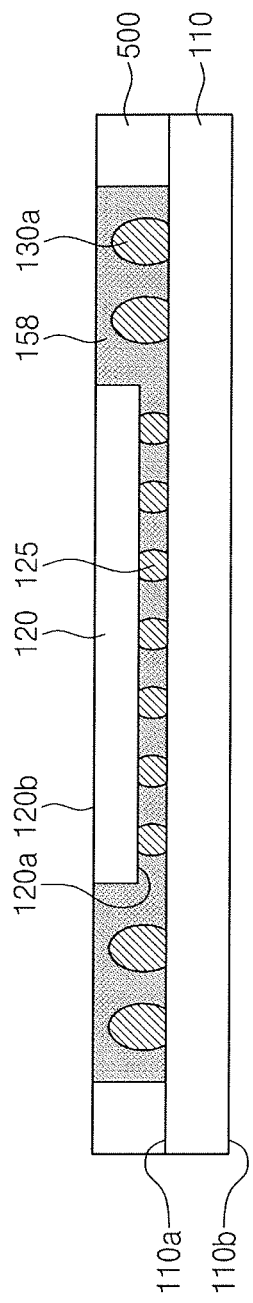

Referring to FIG. 6B, the preliminary lower mold layer 158 may be formed to cover the side surface of the lower semiconductor chip 120 and to still expose the second surface 120b of the lower semiconductor chip 120. The preliminary lower mold layer 158 may be formed to enclose the connection terminals 125 between the lower semiconductor chip 120 and the lower package substrate 110. For example, the preliminary lower mold layer 158 may be formed around the connection terminals 125. In addition, the preliminary lower mold layer 158 may be formed to cover the first lower connection terminals 130a on the lower package substrate 110.

Referring to FIG. 6C, the preliminary lower mold layer 158 may be patterned to form the lower mold layer 150. The lower mold layer 150 may be formed to have the connection holes 155 exposing the first lower connection terminals 130a. Further, the dummy block 500 may be removed. As a result of the removal of the dummy block 500, the outer side surfaces 150c of the lower mold layer 150 may be exposed.

Referring to FIG. 6D, the second lower connection terminals 130b may be formed on a region outside the lower mold layer 150. The second lower connection terminals 130b may be in contact with the outer side surfaces 150c of the lower mold layer 150. In an exemplary embodiment of the present inventive concept, the second lower connection terminals 130b may be spaced apart from the outer side surfaces 150c of the lower mold layer 150. At least a portion of the top surface 110a of the lower package substrate 110, which is positioned outside the second lower connection terminals 130b, may be exposed. For example, the exposed portion of the top surface 110a of the lower package substrate 110 may be positioned on side surfaces of the second lower connection terminals 130b nearest to the edge region of the top surface 110a of the lower package substrate 110. The outer terminals 115 may be formed on the bottom surface 110b of the lower package substrate 110. As a result of the formation of the outer terminals 115, the lower package 100 may be fabricated.

Figure 7:
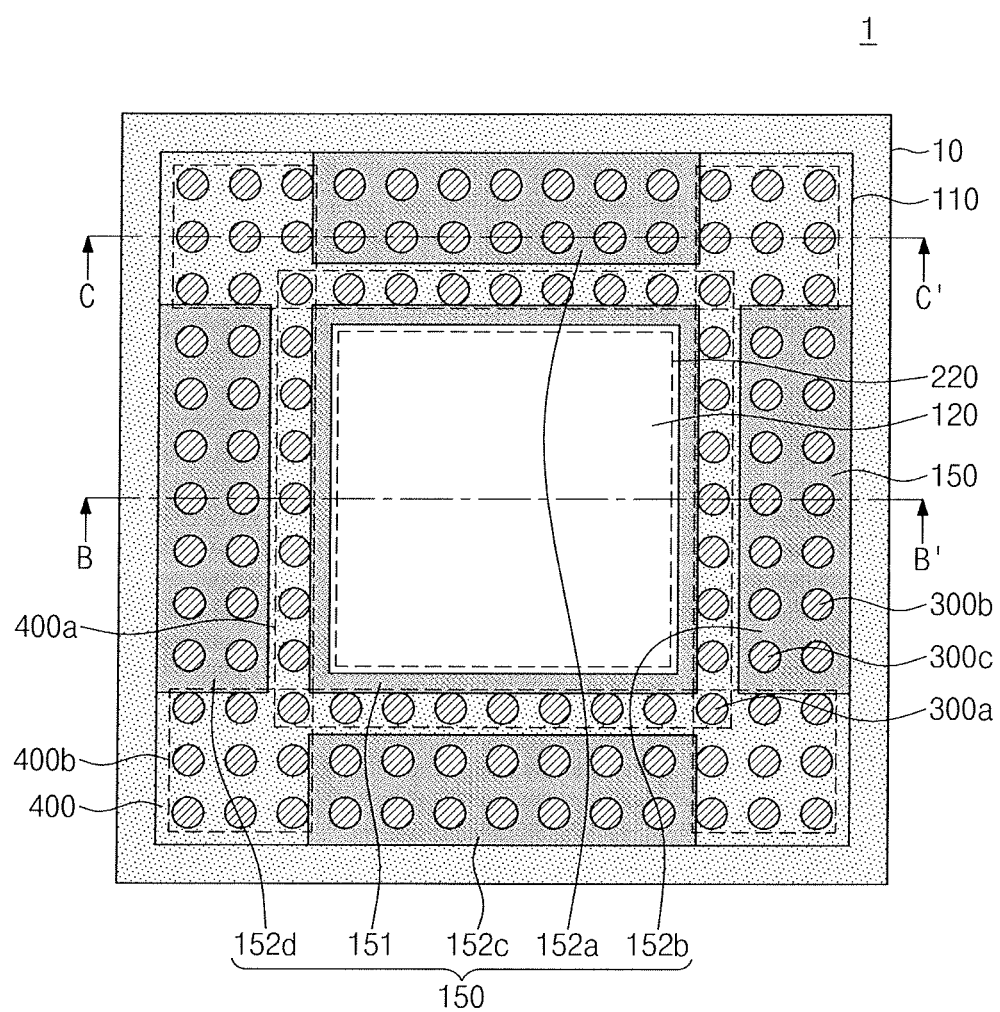
FIG. 7 is a schematic plan view illustrating a semiconductor package according to an exemplary embodiment of the present inventive concept.
Figure 8:
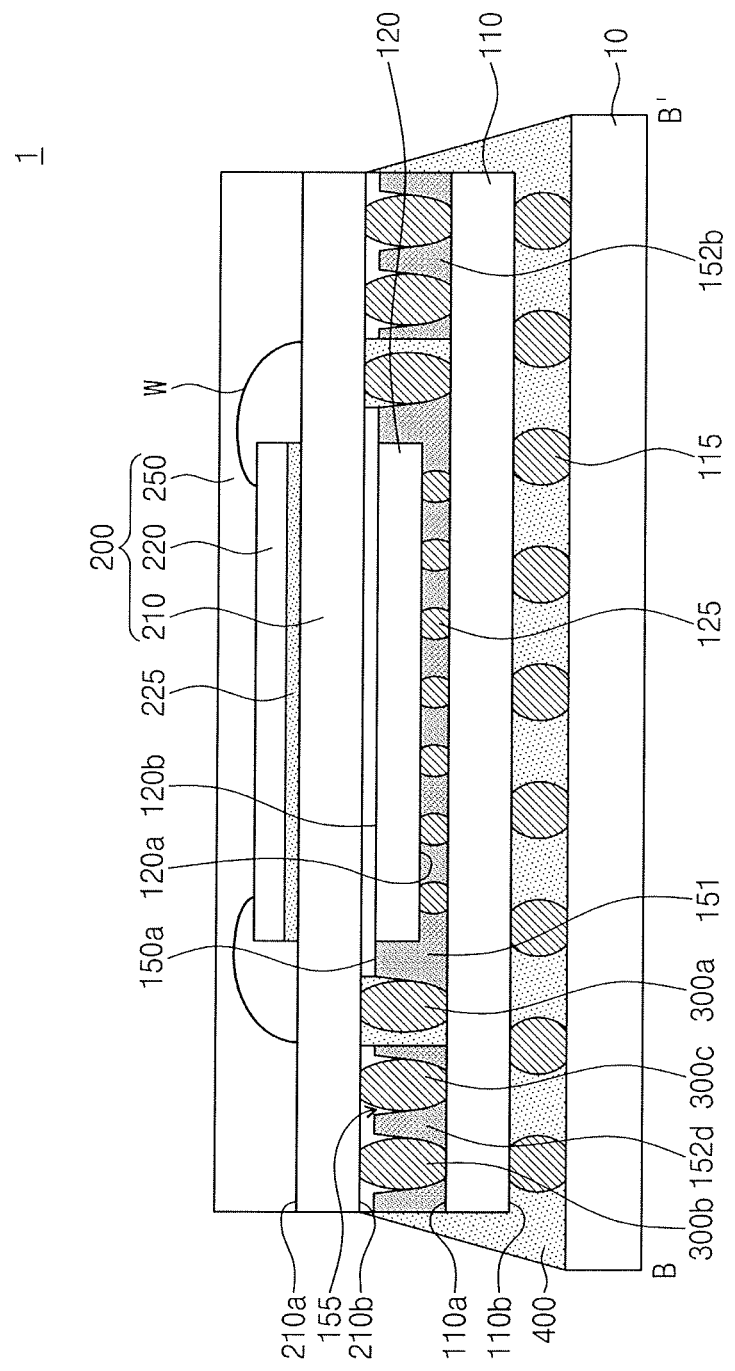
FIG. 8 is a sectional view taken along line B-B' of FIG. 7 according to an exemplary embodiment of the present inventive concept.
Figure 9:
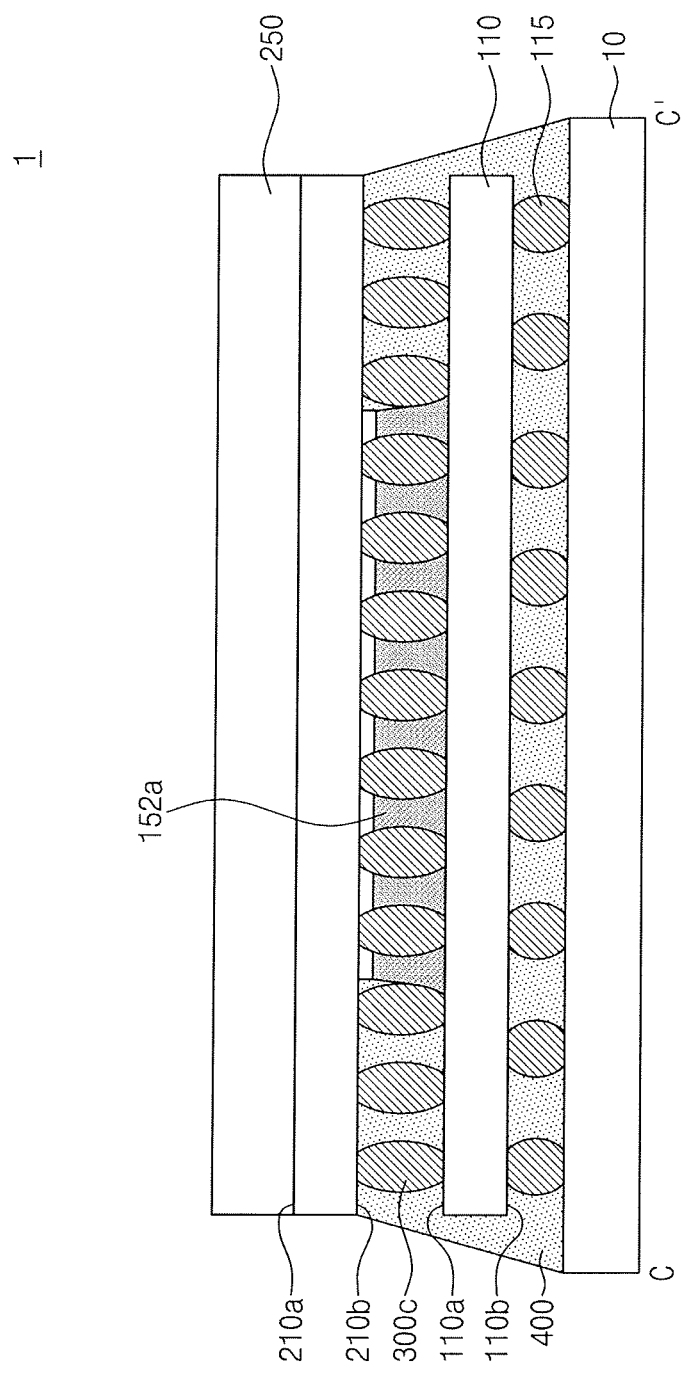
FIG. 9 is a sectional view taken along line C-C' of FIG. 7 according to an exemplary embodiment of the present inventive concept.

FIG. 7 is a schematic plan view illustrating a semiconductor package according to an exemplary embodiment of the present inventive concept. FIG. 8 is a sectional view taken along line B-B' of FIG. 7 according to an exemplary embodiment of the present inventive concept. FIG. 9 is a sectional view taken along line C-C' of FIG. 7 according to an exemplary embodiment of the present inventive concept. The elements and features of this example that are not described may be assumed to be similar to corresponding elements described above.

Referring to FIGS. 7 to 9, connection terminals 300a, 300b, and 300c may include first and second connection terminals 300a and 300b, which are located at innermost and outermost positions with respect to a position of the lower semiconductor chip 120. For example, the first connection terminals 300a may be positioned near the lower semiconductor chip 120, and the second connection terminals 300b may be positioned near the edge of lower package substrate 110. The connections terminals 300a, 300b, and 300c may further include third connection terminals 300c disposed between the first and second connection terminals 300a and 300b. The first connection terminals 300a may enclose the lower semiconductor chip 120 at positions spaced apart from the lower semiconductor chip. The third connection terminals 300c may enclose the first connection terminals 300a. The second connection terminals 300b may enclose the third connection terminals 300c.

The lower mold layer 150 may include a central lower mold layer 151, which is in contact with side surfaces of the lower semiconductor chip 120, and first to fourth lower mold layers 152a, 152b, 152c, and 152d, which are spaced apart from an edge of the central lower mold layer 151. An outer side surface of each of the first to fourth lower mold layers 152a, 152b, 152c, and 152d may be coplanar with a corresponding side surface of the side surfaces of the lower package substrate 110. The first lower mold layer 152a and the third lower mold layer 152c may be disposed to face each other, in a first direction, with respect to the lower semiconductor chip 120. In addition, the second lower mold layer 152b and the fourth lower mold layer 152d may be disposed to face each other, in a second direction which is perpendicular to the first direction, with respect to the lower semiconductor chip 120.

The central lower mold layer 151 may be disposed between the lower semiconductor chip 120 and the lower package substrate 110 to enclose the connection terminals 125 and to cover the side surfaces of the lower semiconductor chip 120. The first connection terminals 300a may be disposed between the central lower mold layer 151 and each of the first to fourth lower mold layers 152a, 152b, 152c, and 152d. Accordingly, side surfaces of each of the first connection terminals 300a may be exposed. The first to fourth lower mold layers 152a, 152b, 152c, and 152d may enclose some of the second connection terminals 300b and the third connection terminals 300c. The first to fourth lower mold layers 152a, 152b, 152c, and 152d may expose corner regions of the lower package substrate 110. The corner regions may be portions of the top surface 110a of the lower package substrate 110 that are adjacent to corner edges of the lower package substrate 110. Thus, each of the connection terminals 300a, 300b, and 300c that are provided on the corner regions of the lower package substrate 110 may be exposed.

The under-fill layer 400 may be provided between the central lower mold layer 151 and each of the first to fourth lower mold layers 152a, 152b, 152c, and 152d and on the corner regions of the lower package substrate 110. The under-fill layer 400 may be in contact with side surfaces of the first connection terminals 300a, which are disposed between the central lower mold layer 151 and each of the first to fourth lower mold layers 152a, 152b, 152c, and 152d, and may be in contact with the connection terminals 300a, 300b, and 300c, which are disposed on the corner regions of the lower package substrate 110.

When viewed in a plan view, as shown in FIG. 7, the under-fill layer 400 may include a first region 400a, which is located between the central lower mold layer 151 and each of the first to fourth lower mold layers 152a, 152b, 152c, and 152d, and second regions 400b, which are located on the corner regions of the lower package substrate 110. The first region 400a may have a rectangular shape around the lower semiconductor chip 120, and each of the second regions 400b may have a polygonal shape (e.g., a rectangular shape). The first region 400a and each of the second regions 400b may partially overlap with one another.

Figure 10:
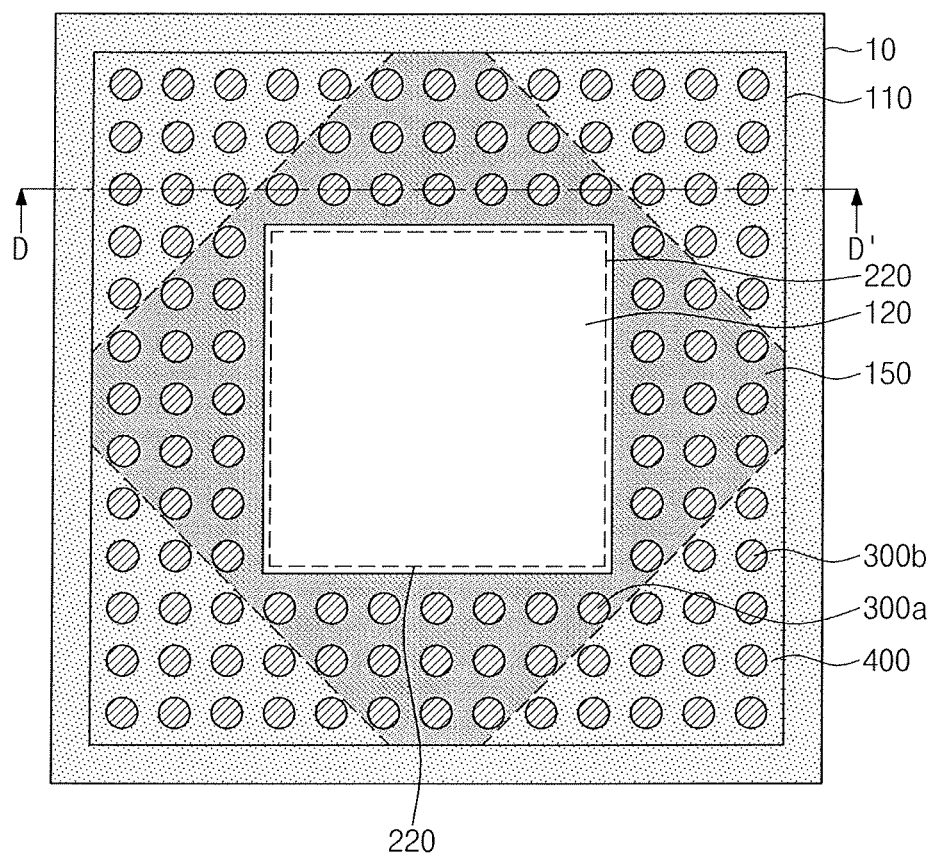
FIG. 10 is a schematic plan view illustrating a semiconductor package according to an exemplary embodiment of the present inventive concept.
Figure 11:
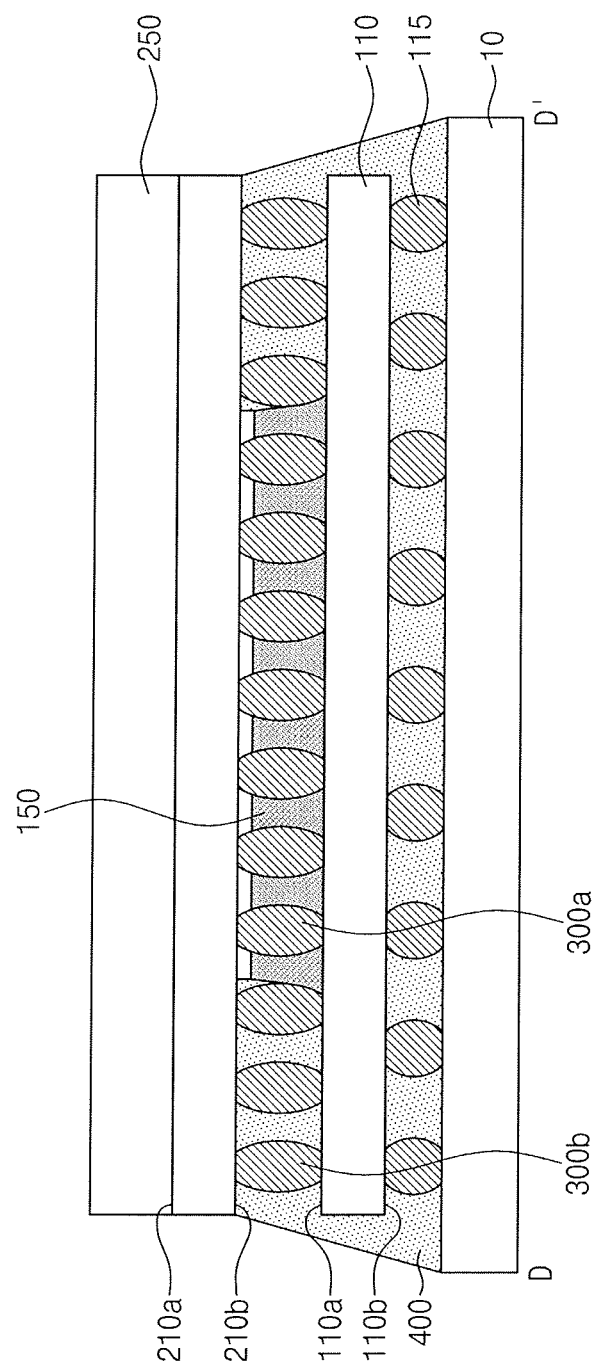
FIG. 11 is a sectional view taken along line D-D' of FIG. 10 according to an exemplary embodiment of the present inventive concept.

FIG. 10 is a schematic plan view illustrating a semiconductor package according to an exemplary embodiment of the present inventive concept. FIG. 11 is a sectional view taken along line D-D' of FIG. 10 according to an exemplary embodiment of the present inventive concept. The elements and features of this example that are not described may be assumed to be similar to corresponding elements described above.

Referring to FIGS. 10 and 11, the connection terminals 300a and 300b may include the inner connection terminals 300a, which are disposed in the lower mold layer 150, and the outer connection terminals 300b, which are disposed outside the lower mold layer 150. The lower mold layer 150 may be provided such that side surfaces of the outer connection terminals 300b that are disposed on the corner regions of the lower package substrate 110 are exposed.

The under-fill layer 400 may cover the side surfaces of the outer connection terminals 300b, which are disposed on the corner regions of the lower package substrate 110. The under-fill layer 400 may fill a space between the outer connection terminals 300b. When viewed in a plan view, as shown in FIG. 10, the under-fill layer 400 may have a triangular shape on the corner regions of the lower package substrate 110.

Figure 12:
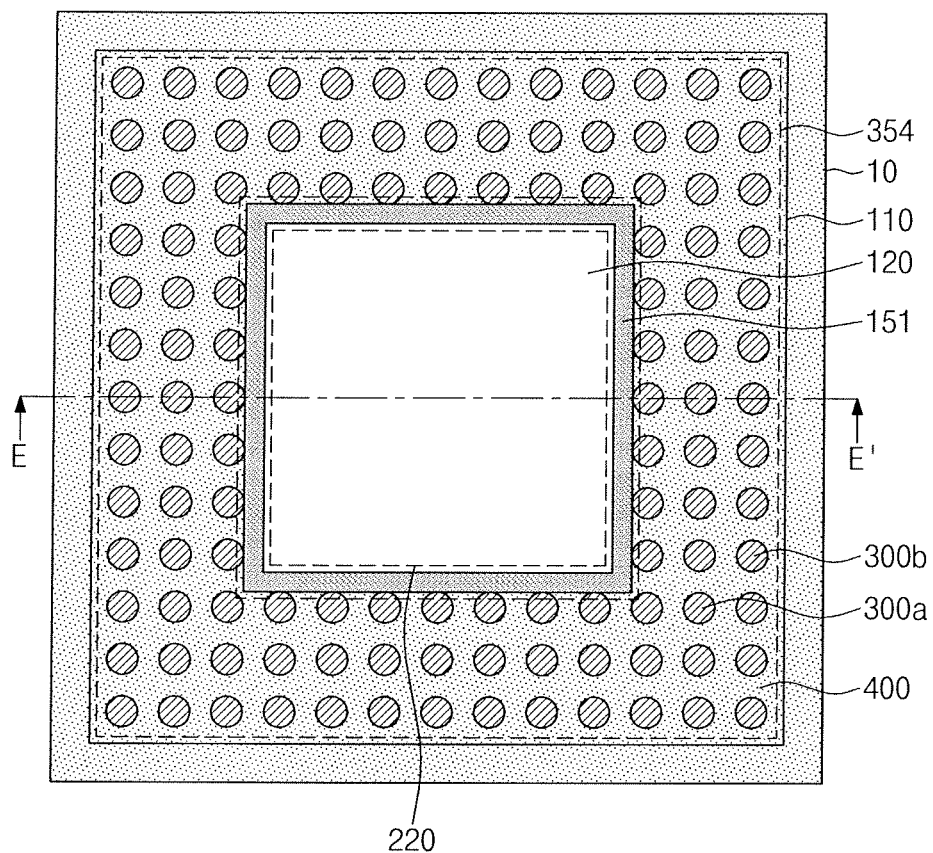
FIG. 12 is a schematic plan view illustrating a semiconductor package according to an exemplary embodiment of the present inventive concept.
Figure 13:
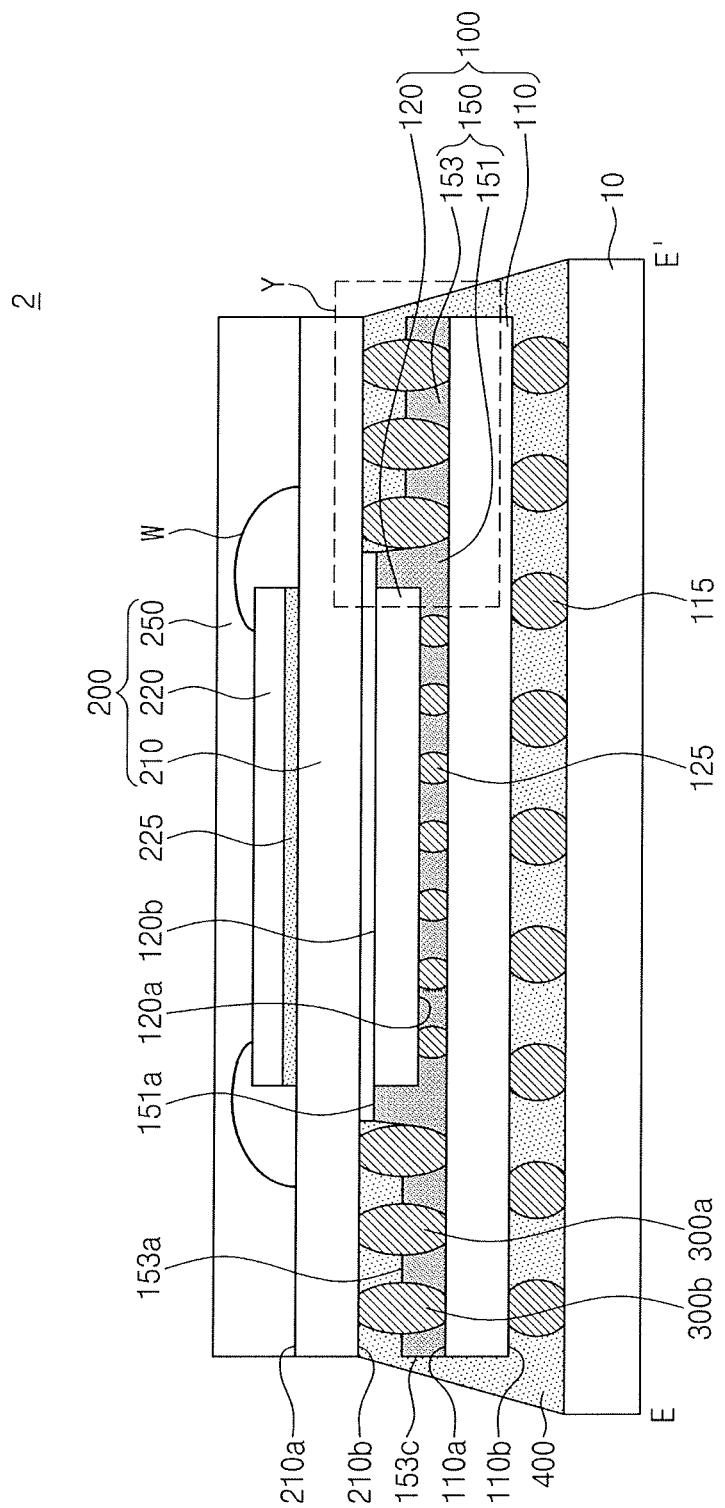
FIG. 13 is a sectional view taken along line E-E' of FIG. 12 according to an exemplary embodiment of the present inventive concept.
Figure 14:
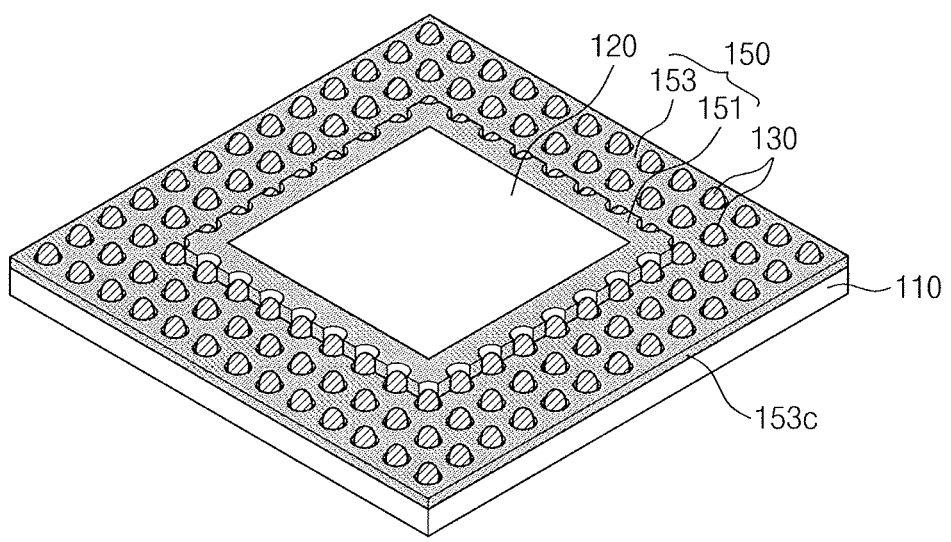
FIG. 14 is a perspective view illustrating the lower package of FIG. 12 according to an exemplary embodiment of the present inventive concept.
Figure 15A:
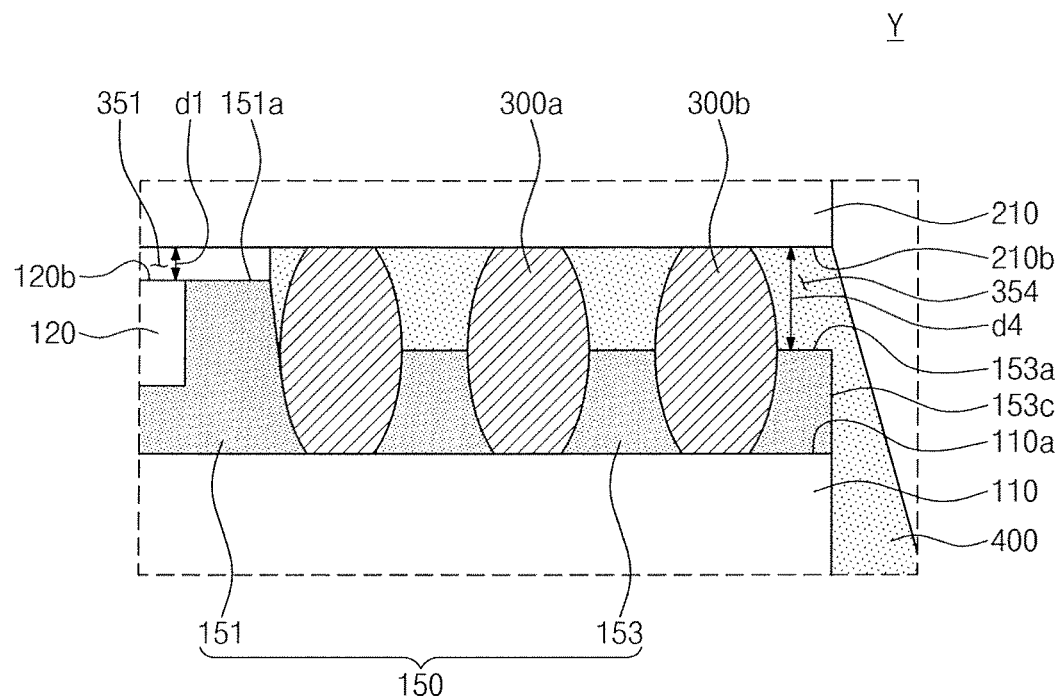
FIGS. 15A and 15B are enlarged views of a region 'Y' of FIG. 13 according to an exemplary embodiment of the present inventive concept.
Figure 15B:
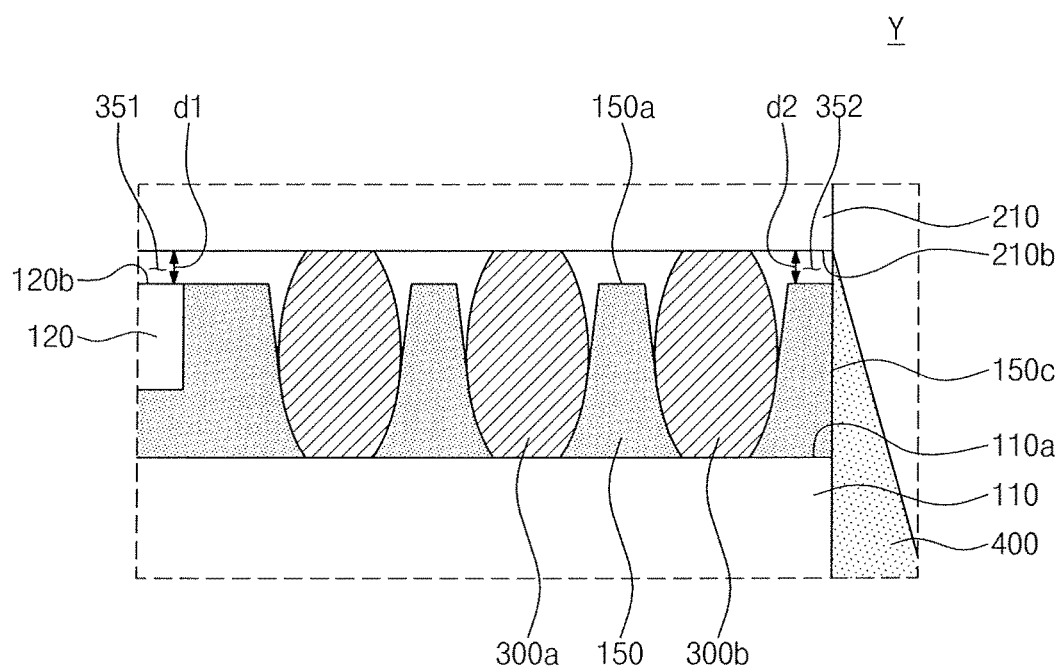

FIG. 12 is a schematic plan view illustrating a semiconductor package according to an exemplary embodiment of the present inventive concept. FIG. 13 is a sectional view taken along line E-E' of FIG. 12 according to an exemplary embodiment of the present inventive concept. FIG. 14 is a perspective view illustrating the lower package of FIG. 12 according to an exemplary embodiment of the present inventive concept. FIGS. 15A and 15B are enlarged views of a region 'Y' of FIG. 13 according to an exemplary embodiment of the present inventive concept. The elements and features of this example that are not described may be assumed to be similar to corresponding elements described above.

Referring to FIGS. 12 to 14 and 15A, the lower mold layer 150 may include a first lower mold layer 151, which is in contact with at least one side surface of the lower semiconductor chip 120 and fills a gap region between the lower semiconductor chip 120 and the lower package substrate 110. The lower mold layer 150 may further include a second lower mold layer 153, which is provided to enclose at least lower side surfaces of the connection terminals 300a and 300b. The first lower mold layer 151 and the second lower mold layer 153 may be provided in a stepwise shape. For example, the first lower mold layer 151 may have a first top surface 151a, and the second lower mold layer 153 may have a second top surface 153a that is lower than the first top surface 151a. The first top surface 151a may be substantially coplanar (e.g., aligned) with the second surface 120b of the lower semiconductor chip 120 and may be higher than the second top surface 153a.

Hereinafter, a space between the bottom surface 210b of the upper package substrate 210 and the second surface 120b of the lower semiconductor chip 120 may be referred to as a 'first space 351'. In addition, a space between the bottom surface 210b of the upper package substrate 210 and the second top surface 153a of the second lower mold layer 153 may be referred to as a 'fourth space 354'. The first space 351 may have a first height d1, which is a distance between the bottom surface 210b of the upper package substrate 210 and the second surface 120b of the lower semiconductor chip 120. The fourth space 354 may have a fourth height d4, which is a distance between the bottom surface 210b of the upper package substrate 210 and the second top surface 153a of the second lower mold layer 153. The fourth height d4 may be greater than the first height d1.

The second lower mold layer 153 may expose upper side surfaces of the connection terminals 300a and 300b. The second lower mold layer 153 may be connected to the first lower mold layer 151 and may extend from the first lower mold layer 151 toward the outermost connection terminals 300b. The second lower mold layer 153 may at least partially cover the top surface 110a of the lower package substrate 110. For example, the second lower mold layer 153 may extend to an edge of the lower package substrate 110, and the second lower mold layer 153 may have an outer side surface 153c that is substantially coplanar with the side surfaces of the lower package substrate 110.

The under-fill layer 400 may cover upper side surfaces of the connection terminals 300a and 300b exposed by the second lower mold layer 153. The under-fill layer 400 may fill a gap between the connection terminals 300a and 300b. In addition, the under-fill layer 400 may be provided between the second top surface 153a of the second lower mold layer 153 and the bottom surface 210b of the upper package substrate 210, and the under-fill layer 400 may be in contact with the top surface 153a of the second lower mold layer 153 and the bottom surface 210b of the upper package substrate 210. For example, the under-fill layer 400 may fill the fourth space 354.

Further, the outer side surface 150c of the lower mold layer 150 may be aligned (e.g., coplanar) with the side surface of the lower package substrate 110, as shown in FIG. 15B. In this case, the fourth space 354 shown in FIG. 15A might not be provided. Instead, the second space 352 may be provided. Since the second space 352 is less than the fourth space 354, the under-fill layer 400 injected through the second space 352 might not be in contact with the outermost connection terminals 300b. As a result, an empty space may be formed between the edge regions of the lower and upper package substrates 110 and 210, and this may lead to a difficulty in protecting the semiconductor package against an external or internal force (e.g., physical impact).

According to an exemplary embodiment of the present inventive concept, the under-fill layer 400 may be injected into the fourth space 354. Since the fourth space 354 is greater than the second space 352, the under-fill layer 400 may be injected into the fourth space 354 and may be in contact with the outermost connection terminals 300b. Furthermore, the under-fill layer 400 may be in contact with the inner connection terminals 300a. Thus, the space between the bottom surface 210b of the upper package substrate 210 and the second top surface 153a of the second lower mold layer 153 may be filled with the under-fill layer 400, and the upper package substrate 210 may be connected to the second lower mold layer 153. Accordingly, it is possible to prevent the connection terminals 300a and 300b from being damaged by an external or internal force (e.g., a physical impact) and thereby to increase mechanical stiffness of the semiconductor package 2.

Figure 16:
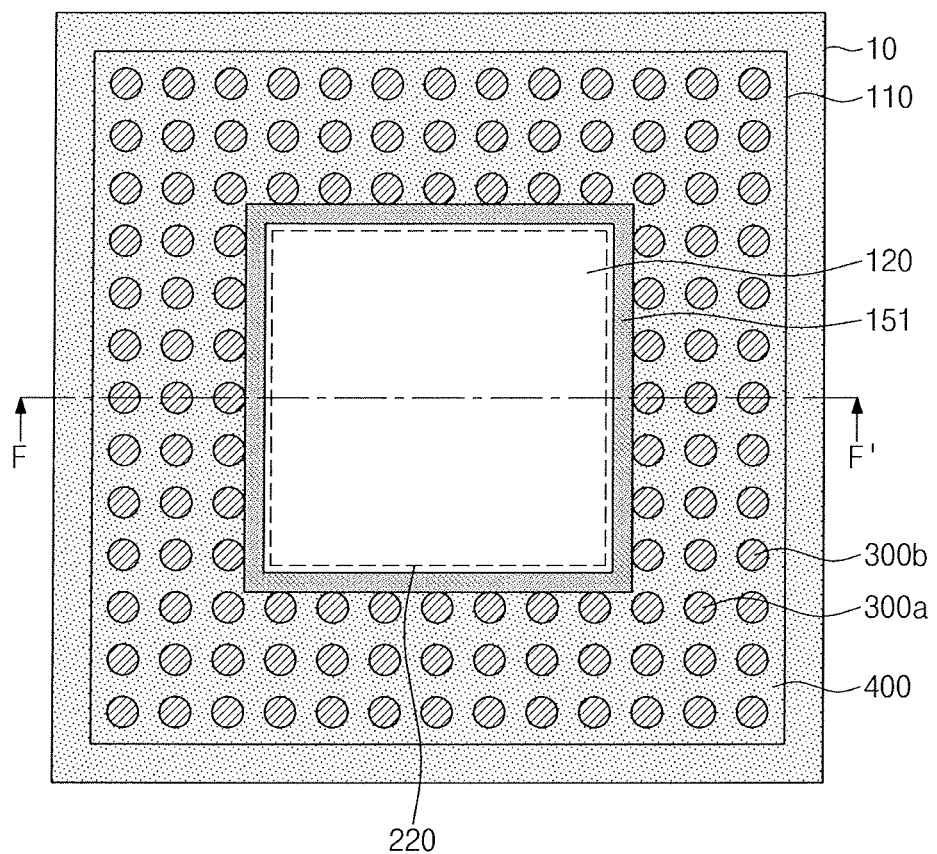
FIG. 16 is a schematic plan view illustrating a semiconductor package according to an exemplary embodiment of the present inventive concept.
Figure 17:
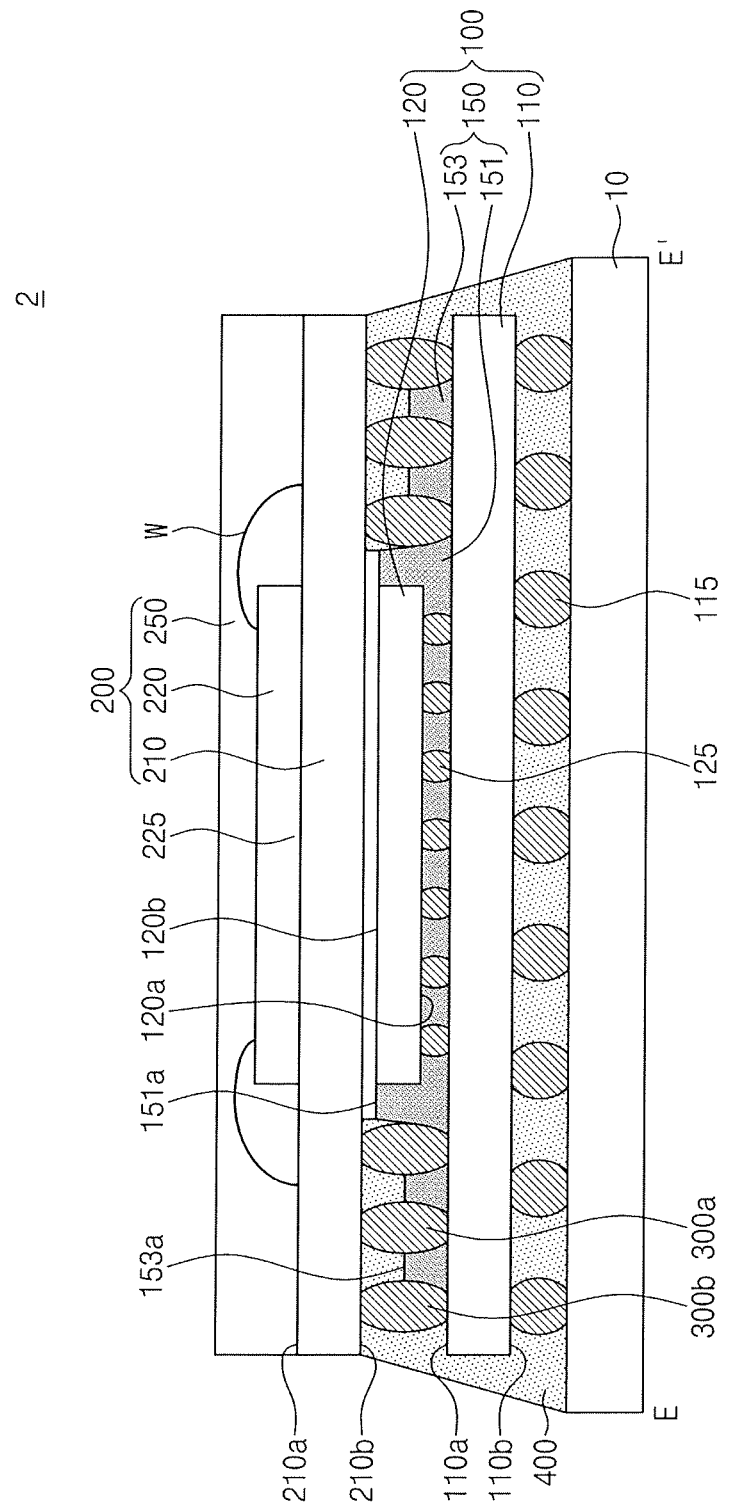
FIG. 17 is a sectional view taken along line F-F of FIG. 16 according to an exemplary embodiment of the present inventive concept.
Figure 18:
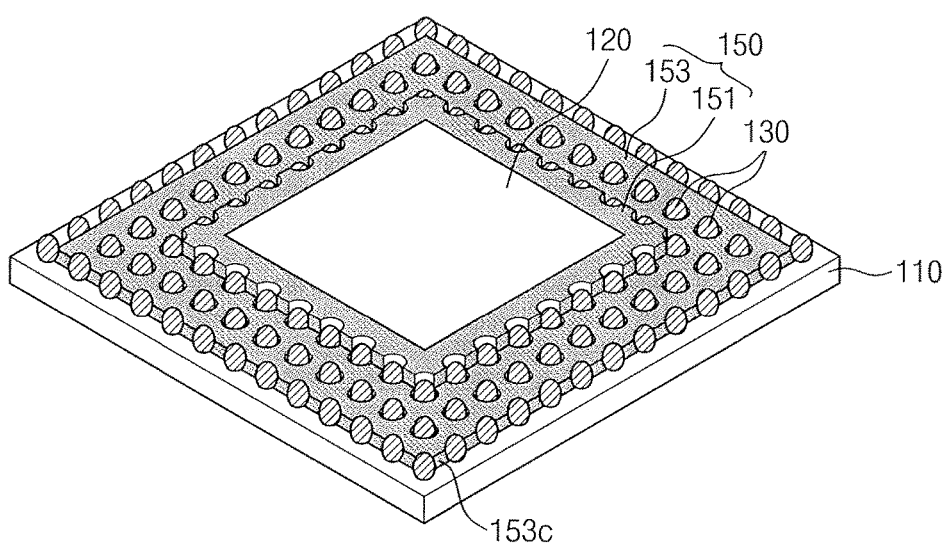
FIG. 18 is a perspective view illustrating the lower package of FIG. 16 according to an exemplary embodiment of the present inventive concept.

FIG. 16 is a schematic plan view illustrating a semiconductor package according to exemplary embodiments of the present inventive concept. FIG. 17 is a sectional view taken along line F-F' of FIG. 16 according to an exemplary embodiment of the present inventive concept. FIG. 18 is a perspective view illustrating the lower package of FIG. 16 according to an exemplary embodiment of the present inventive concept. The elements and features of this example that are not described may be assumed to be similar to corresponding elements described above.

Referring to FIGS. 16 to 18, the second lower mold layer 153 may expose an edge region of the lower package substrate 110. For example, the second lower mold layer 153 may expose the top surface 110a of the lower package substrate 110 in a rectangular shape. For example, the rectangular shape would be around the lower semiconductor chip 120. In addition, the second lower mold layer 153 may be provided such that a side surface of the outermost connection terminal 300b may be exposed.

The second lower mold layer 153 may extend from the first lower mold layer 151 to a region between the outermost connection terminals 300b and the inner connection terminals 300a adjacent thereto. In an exemplary embodiment of the present inventive concept, the outermost connection terminals 300b may be provided outside the second lower mold layer 153 and may be in contact with the outer side surface 153c of the second lower mold layer 153. The second lower mold layer 153 may allow side surfaces of the outermost connection terminals 300b to be exposed between the lower package 100 and the upper package 200.

The under-fill layer 400 may cover the top surface 110a of the lower package substrate 110 exposed by the second lower mold layer 153. In addition, the under-fill layer 400 may cover upper side surfaces of the connection terminals 300a and 300b exposed by the second lower mold layer 153 and may fill a gap region between the connection terminals 300a and 300b. The under-fill layer 400 may be in contact with the second top surface 153a of the second lower mold layer 153 and the bottom surface 210b of the upper package substrate 210.

According to an exemplary embodiment of the present inventive concept, an under-fill layer may fasten edge portions of upper and lower package substrates to each other. Accordingly, it is possible to prevent connection terminals from being damaged by an external or internal force (e.g., a physical impact) and, consequently, to increase mechanical stiffness of a semiconductor package.

While the present inventive concept has been particularly shown and described with reference to exemplary embodiments thereof, it will be apparent to those of ordinary skill in the art that various changes in form and detail may be made thereto without departing from the spirit and scope of the present inventive concept.

What is claimed is:

1. A semiconductor package, comprising:
    a lower package comprising a lower package substrate, a lower semiconductor chip disposed on the lower package substrate, and a lower mold layer disposed on the lower package substrate;
    an upper package disposed on the lower package, wherein the upper package comprises an upper package substrate and an upper semiconductor chip disposed on the upper package substrate;
    a plurality of connection terminals disposed between the lower and upper package substrates, wherein the plurality of connection terminals comprises a plurality of outermost connection terminals and a plurality of inner connection terminals, wherein the plurality of inner connection terminals is disposed between the lower semiconductor chip and the plurality of outermost connection terminals; and
    a first under-fill layer disposed between the lower package substrate and the upper package substrate,
    wherein a first outermost connection terminal of the plurality of outermost connection terminals is disposed outside of the lower mold layer, wherein the first outermost connection terminal includes a first side surface and a second side surface opposite the first side surface, wherein the first side surface faces the lower semiconductor chip and is in contact with the lower mold layer, and the second side surface is not in contact with the lower mold layer.

2. The semiconductor package of claim 1, wherein the first under-fill layer is in contact with a portion of a top surface of the lower package substrate and a portion of a bottom surface of the upper package substrate.

3. The semiconductor package of claim 1, wherein the first under-fill layer is disposed between the plurality of outermost connection terminals, which is disposed outside the lower mold layer, to connect the plurality of outermost connection terminals to the mold layer.

4. The semiconductor package of claim 1, wherein the lower mold layer exposes a top surface of a region of the lower package substrate, wherein the region is adjacent to edges of the lower package substrate, and
    each of the plurality of outermost connection terminals disposed outside of the lower mold layer.

5. The semiconductor package of claim 1, wherein, when viewed in a plan view, the lower package substrate has a rectangular shape, and
 the lower mold layer exposes a top surface of the lower package substrate in a rectangular shape around the lower semiconductor chip.

6. The semiconductor package of claim 1, wherein the first outermost connection terminal of the outermost connection terminals disposed outside of the lower mold layer is in contact with an outer side surface of the lower mold layer.

7. The semiconductor package of claim 1, wherein, when viewed in a plan view, the lower mold layer exposes corner regions of the lower package substrate that are adjacent to corner edges of the lower package substrate, and
 the plurality of inner connection terminals and the plurality of outermost connection terminals disposed on the corner regions are disposed outside of the lower mold layer.

8. The semiconductor package of claim 1, wherein the lower mold layer comprises:
 a central lower mold layer in contact with side surfaces of the lower semiconductor chip; and
 first to fourth lower mold layers, whose outer side surfaces are spaced apart from the central lower mold layer and are aligned with respective edges of the lower package substrate,
 wherein the first to fourth lower mold layers expose corner regions of the lower package substrate.

9. The semiconductor package of claim 1, further comprising:
 plurality of outer terminals disposed on a bottom surface of the lower package substrate;
 a board connected to the plurality of outer terminals; and
 a second under-fill layer disposed between the bottom surface of the lower package substrate and a top surface of the board to enclose the plurality of outer terminals.

10. A semiconductor package, comprising:
 a lower package comprising a lower package substrate, a lower semiconductor chip disposed on the lower package substrate, and a lower mold layer disposed on the lower package substrate;
 an upper package disposed on the lower package, wherein the upper package comprises an upper package substrate and an upper semiconductor chip disposed on the upper package substrate;
 an under-fill layer disposed between the lower mold layer and the upper package substrate; and
 a plurality of connection terminals disposed between the lower package and the upper package, wherein the plurality of connection terminals connects the lower package to the upper package and includes a plurality of innermost connection terminals adjacent to side surfaces of the lower semiconductor chip, wherein each innermost connection terminal includes a first side surface facing the lower semiconductor chip and a second side surface opposite the first side surface,
 wherein the lower mold layer comprises:
 a first lower mold layer in contact with the side surfaces of the lower semiconductor chip; and
 a second lower mold layer connected to the first lower mold layer and enclosing at least lower side surfaces of each of the plurality of connection terminals,
 wherein the first lower mold layer has a top surface that is positioned at a higher level than a top surface of the second lower mold layer,
 wherein more of the first side surface of each innermost connection terminal is covered by the first lower mold layer than the second side surface is covered by the second lower mold layer.

11. The semiconductor package of claim 10, wherein edges of the second lower mold layer are aligned with edges of the lower package substrate.

12. The semiconductor package of claim 10, wherein the under-fill layer encloses upper side surfaces of the plurality of connection terminals exposed by the second lower mold layer and is in contact with the top surface of the second lower mold layer and a bottom surface of the upper package substrate.

13. The semiconductor package of claim 10, wherein each of the plurality of the connection terminals further comprises:
 an outermost connection terminal which are positioned past the lower semiconductor chip,
 wherein the outermost connection terminal is disposed outside of the second lower mold layer.

14. The semiconductor package of claim 13, wherein the second lower mold layer exposes an edge region of a top surface of the lower package substrate, and
 the under-fill layer is in contact with the exposed top surface of the lower package substrate.

15. The semiconductor package of claim 13, wherein, when viewed in a plan view, the lower package substrate has a rectangular shape, and
 the second lower mold layer exposes an edge region of the lower package substrate in a rectangular shape enclosing the lower semiconductor chip.

16. A semiconductor package, comprising:
 a first package comprising a lower package substrate, a lower semiconductor chip disposed on the lower package substrate, and a lower mold layer disposed on the lower package substrate;
 a second package disposed on the first package, wherein the second package comprises an upper package substrate and an upper semiconductor chip disposed on the upper package substrate;
 a plurality of connection terminals disposed between the lower and upper package substrates, wherein the plurality of connection terminals electrically connects the first package and the second package and includes a plurality of innermost connection terminals adjacent to side surfaces of the lower semiconductor chip, wherein each innermost connection terminal includes a first side surface facing the lower semiconductor chip and a second side surface opposite the first side surface; and
 an under-fill layer disposed on the lower package substrate,
 wherein the lower mold layer comprises:
 a first lower mold layer in contact with the side surfaces of the lower semiconductor chip; and
 a second lower mold layer enclosing at least lower side surfaces of each of the plurality of connection terminals,
 wherein at least one connection terminal of the plurality of connection terminals has a side surface in contact with the under-fill layer,
 wherein more of the first side surface of each innermost connection terminal is covered by the first lower mold layer than the second side surface is covered by the second lower mold layer.

17. The semiconductor package of claim 16, wherein the first lower mold layer and the second lower mold layer are connected to one another, and the first lower mold layer has a top surface positioned higher than a top surface of the second lower mold layer.

18. The semiconductor package of claim 17, wherein each of the plurality of connection terminals is at least partially enclosed by the first and second lower mold layers.

19. The semiconductor package of claim 16, wherein, when viewed in a plan view, the under-fill layer has a triangular shape on at least one corner region of the lower package substrate.

20. The semiconductor package of claim 16, wherein, when viewed in a plan view, the lower mold layer exposes a top surface of the lower package substrate in a first rectangular shape around the lower semiconductor chip and a second rectangular shape on at least one corner region of the lower package substrate, wherein the first rectangular shape at least partially overlaps the second rectangular shape.

* * * * *